(12) United States Patent
Aida et al.

(10) Patent No.: US 9,105,472 B2
(45) Date of Patent: Aug. 11, 2015

(54) SINGLE-CRYSTAL SUBSTRATE,SINGLE-CRYSTAL SUBSTRATE HAVING CRYSTALLINE FILM,CRYSTALLINE FILM,METHOD FOR PRODUCING SINGLE-CRYSTAL SUBSTRATE HAVING CRYSTALLINE FILM,METHOD FOR PRODUCING CRYSTALLINE SUBSTRATE,AND METHOD FOR PRODUCING ELEMENT

(75) Inventors: Hideo Aida, Tokyo (JP); Natsuko Aota, Tokyo (JP)

(73) Assignee: NAMIKI SEIMITSU HOUSEKI KABUSHIKI KAISHA (JP)

( * ) Notice: Subject to any disclaimer, the term of this patent is extended or adjusted under 35 U.S.C. 154(b) by 0 days.

(21) Appl. No.: 13/639,143

(22) PCT Filed: Apr. 6, 2011

(86) PCT No.: PCT/JP2011/058734
§ 371 (c)(1),
(2), (4) Date: Oct. 3, 2012

(87) PCT Pub. No.: WO2011/129246
PCT Pub. Date: Oct. 20, 2011

(65) Prior Publication Data
US 2013/0022773 A1    Jan. 24, 2013

(30) Foreign Application Priority Data

Apr. 13, 2010  (JP) ................................ 2010-092614
Jun. 30, 2010  (JP) ................................ 2010-148880

(51) Int. Cl.
*B32B 3/00* (2006.01)
*H01L 21/02* (2006.01)
(Continued)

(52) U.S. Cl.
CPC ............ *H01L 21/0254* (2013.01); *C30B 25/18* (2013.01); *C30B 29/403* (2013.01);
(Continued)

(58) Field of Classification Search
CPC . H01L 21/302; H01L 21/306; H01L 21/3046; C30B 29/06
See application file for complete search history.

(56) References Cited

U.S. PATENT DOCUMENTS

2002/0197841 A1   12/2002  Nagai et al.
2004/0053505 A1 *  3/2004  Chinn et al. ................... 438/710
(Continued)

FOREIGN PATENT DOCUMENTS

JP      H0473930 A     3/1992
JP    2002-299252 A   10/2002
(Continued)

OTHER PUBLICATIONS

International Search Report for International Application No. PCT/JP2011/058734 mailing date of Jul. 12, 2011 with English translation.

(Continued)

*Primary Examiner* — Elizabeth Mulvaney
(74) *Attorney, Agent, or Firm* — Cantor Colburn LLP

(57) ABSTRACT

Provided are a single-crystal substrate for epitaxial growth on which a crystalline film may be formed with stress thereon being suppressed or eliminated, a single-crystal substrate having a crystalline film, a crystalline film, a method of producing a single-crystal substrate having a crystalline film, a method of producing a crystalline substrate, and an element producing method. The single-crystal substrate has a roughened surface formed on at least a partial region of a surface of the single-crystal substrate. And in order to obtain the single-crystal substrate having a crystalline film, a single-crystalline film is formed by epitaxial growth on a roughened-surface unformed surface on which the roughened surface is not formed, and a crystalline film having low crystallinity than the single-crystalline film is formed by epitaxial growth on a roughened-surface formed surface of the single-crystal substrate.

59 Claims, 13 Drawing Sheets

(51) Int. Cl.
*C30B 25/18* (2006.01)
*C30B 29/40* (2006.01)

(52) U.S. Cl.
CPC ........ *H01L21/0242* (2013.01); *H01L 21/0243* (2013.01); *H01L 21/02658* (2013.01); *Y10T 428/21* (2015.01); *Y10T 428/24355* (2015.01)

(56) References Cited

U.S. PATENT DOCUMENTS

| | | | |
|---|---|---|---|
| 2009/0267190 | A1 | 10/2009 | Fujiwara et al. |
| 2012/0018732 | A1* | 1/2012 | Aida et al. ............... 257/75 |
| 2012/0070962 | A1 | 3/2012 | Fujiwara et al. |
| 2013/0062734 | A1* | 3/2013 | Aida et al. .............. 257/615 |
| 2013/0161797 | A1* | 6/2013 | Aida et al. .............. 257/622 |

FOREIGN PATENT DOCUMENTS

| | | |
|---|---|---|
| JP | 2004103672 A | 4/2004 |
| JP | 2004-168622 A | 6/2004 |
| JP | 2005327821 A | 11/2005 |
| JP | 2006203058 A | 8/2006 |
| JP | 2007-131527 A | 5/2007 |
| JP | 2009158696 A | 7/2009 |
| JP | 2009177212 A | 8/2009 |
| JP | 2009-266874 A | 11/2009 |
| JP | 2009280482 A | 12/2009 |

OTHER PUBLICATIONS

Japanese Notice of Reasons for Rejection corresponding to Application No. JP2012-510631; Date of Mailing: Mar. 3, 2015, with English translation.

Extended European Search Report corresponding to Application No. 11768767.3-1552/2559791, PCT/JP2011058734; Date of Mailing: May 11, 2015.

* cited by examiner

SINGLE-CRYSTAL SUBSTRATE, SINGLE-CRYSTAL SUBSTRATE HAVING CRYSTALLINE FILM, CRYSTALLINE FILM, METHOD FOR PRODUCING SINGLE-CRYSTAL SUBSTRATE HAVING CRYSTALLINE FILM, METHOD FOR PRODUCING CRYSTALLINE SUBSTRATE, AND METHOD FOR PRODUCING ELEMENT

CROSS REFERENCE TO RELATED APPLICATIONS

This is a U.S. national stage of application No. PCT/JP2011/058734, filed on 6 Apr. 2011. Priority under 35 U.S.C. §119 (a) and 35 U.S.C. §365 (b) is claimed from Japanese Application Nos. 2010-092614, filed 13 Apr. 2011 and JP 2010-148880, filed 30 Jun. 2010, the disclosure of which are also incorporated herein by reference.

TECHNICAL FIELD

The present invention relates to a single-crystal substrate, a single-crystal substrate having a crystalline film, a crystalline film, a method of producing a single-crystal substrate having a crystalline film, a method of producing a crystalline substrate, and an element producing method.

BACKGROUND ART

A nitride semiconductor represented by gallium nitride (GaN) has a wide band gap and is capable of emitting blue light, and thus, is widely used for a light-emitting diode (LED), a semiconductor laser (LD), and the like. For example, a white LED in which a blue LED containing GaN and a substance emitting yellow light are combined is widespread as a backlight of a liquid crystal display (LCD) of a mobile telephone and the like. Further, a white LED has the advantage of low power consumption, a long life, and the like, and thus, is expected as a light source excellent in environmental friendliness to replace a fluorescent lamp and an incandescent lamp and is vigorously researched and developed.

A crystalline film of a nitride semiconductor is formed by epitaxial growth on a surface of a substrate for epitaxial growth (hereinafter referred to as "substrate for growth") represented by a sapphire substrate. However, there is a difference in lattice constant between the substrate for growth and the crystalline film formed on the surface of the substrate for growth, and thus, the crystalline film is formed on the surface of the substrate for growth under a state in which stress is always applied thereon.

This stress causes a large extent of warpage of the substrate for growth and the crystalline film. Due to this warpage, when an electrode pattern is formed on the surface of the crystalline film by a photolithography step in producing the elements such as LEDs, the focal length of light differs in exposure between a center portion and a peripheral portion of the substrate for growth. Therefore, it is difficult to uniformly perform the photolithography step on the surface of the crystalline film, and, as the substrate becomes as large as one having a diameter of the substrate for growth of 2 inches or larger, unevenness (nonuniformity) of the photolithography step becomes more conspicuous.

In order to prevent the unevenness, it has been devised that heat treatment of the substrate for growth and the crystalline film is carried out at a temperature that is lower than the temperature at which the warpage is completely relieved to make a substrate for growth having warpage in a direction opposite to that of the warpage caused by the epitaxial growth (see, for example, Patent Literature 1).

Further, when a crystalline film having such a thickness that the crystalline film can stand on its own is formed on a surface of a substrate for growth by epitaxial growth, due to stress caused in the crystalline film, a crack develops in the crystalline film. As a method for suppressing the crack, a method of producing a crystalline film is invented in which a mask material in the shape of a lattice is formed on the surface of the substrate for growth to form an epitaxial formation region of the crystalline film as small regions which are independent of one another (see, for example, Patent Literature 2).

Patent Literature 2 discloses a method of producing a nitride semiconductor film capable of simultaneously suppressing a crack and threading dislocation. As illustrated in FIG. 14, Patent Literature 2 discloses that a silicon oxide mask material 100 on which a nitride semiconductor film is not epitaxially grown is formed in the shape of a lattice, and, by exposing portions of a surface of a substrate 101 for growth so as to be separate from one another, the epitaxial growth region is formed as small regions which are independent of one another. By forming a reaction preventing layer 102 mainly formed of a monocrystal on the exposed portions of the surface, chemical reaction between the substrate 101 for growth and a nitride semiconductor film 103 thereabove due to stress and heat is prevented from occurring during the production process.

By forming, after this, a distortion relaxing layer 104 by alternately forming nitride semiconductor films of the same or different compositions in two different temperature ranges, stress between the substrate 101 for growth and the nitride semiconductor film 103 may be relaxed, and thus, development of a crack in the nitride semiconductor film 103 may be suppressed.

CITATION LIST

Patent Literature

PTL 1: JP 2004-168622 A
PTL 2: JP 2002-299252 A

SUMMARY OF INVENTION

Technical Problem

However, in order to make a substrate for growth having warpage which cancels warpage caused in the epitaxial growth, that is, having warpage in a direction opposite to that of the warpage caused in the epitaxial growth, by carrying out heat treatment in advance at a temperature that is lower than the temperature at which the warpage is completely relaxed according to the method disclosed in Patent Literature 1, it is necessary to measure the distortion of the substrate for growth prior to the heat treatment and to change the temperature of the heat treatment according to the amount of the distortion, which is not suitable for mass production and results in increase in cost of the substrate. In addition, the temperature in the epitaxial growth is ordinarily higher than the temperature of the heat treatment and distortion intentionally caused to remain is relaxed during the epitaxial growth, and thus, it is extremely difficult to obtain the substrate for growth and the crystalline film having the target amount of warpage after the epitaxial growth, and warpage remains in the substrate for growth and the crystalline film after the epitaxial growth. Therefore, when an attempt is made to affix the substrate for growth to a lapping machine for lapping treatment of a rear surface of the substrate for growth, the substrate for growth and the crystalline film are required to be pressed with heavy pressure against the lapping machine due to the warpage, and the pressure causes a crack in the substrate for growth and the crystalline film.

Further, with the conventional method of producing a nitride semiconductor film as in Patent Literature 2, a single nitride semiconductor film as small as 10 mm per side may be formed. However, the size of the nitride semiconductor film is too small, and thus, taking mass productivity into consideration, formation of a relatively large-sized nitride semiconductor film of, for example, 2 inches or more is desired.

The present invention has been made based on the above-mentioned problems, and an object of the present invention is to provide a single-crystal substrate for epitaxial growth on which a crystalline film may be formed with stress thereon being suppressed or eliminated, a single-crystal substrate having a crystalline film, a crystalline film, a method of producing a single-crystal substrate having a crystalline film, a method of producing a crystalline substrate, and an element producing method.

Solution to Problem

The above-mentioned object is attained by the present invention as follows.

A single-crystal substrate according to the present invention has a roughened surface formed on at least a partial region of a surface of the single-crystal substrate.

Further, in an embodiment of the single-crystal substrate according to the present invention, it is preferred that the roughened surface formed on the surface of the single-crystal substrate be in a shape of any one of stripes, a cross, a lattice, a plurality of arranged polygons, concentric circles, a coil, a line symmetry with respect to a straight line passing through a center point of the single-crystal substrate, and a point symmetry with respect to the center point of the single-crystal substrate.

Further, in another embodiment of the single-crystal substrate according to the present invention, it is preferred that the roughened surface be formed on the surface of the single-crystal substrate so as to be discontinuous.

Further, in yet another embodiment of the single-crystal substrate according to the present invention, it is preferred that the roughened surface be formed over a plurality of portions which are independent of one another on the surface of the single-crystal substrate.

Further, in still another embodiment of the single-crystal substrate according to the present invention, it is preferred to have a diameter of 2 inches or more.

Further, in still another embodiment of the single-crystal substrate according to the present invention, it is preferred that a width of the roughened surface be more than 0 μm and 80 μm or less.

Further, in still another embodiment of the single-crystal substrate according to the present invention, it is preferred that the width of the roughened surface be more than 0 μm and 10 μm or less.

Further, in still another embodiment of the single-crystal substrate according to the present invention, it is preferred that an area of the partial region in which the roughened surface is formed with respect to an entire area of the surface of the single-crystal substrate be in a range of more than 0% and 50% or less.

Further, according to the present invention, there is provided a single-crystal substrate having a crystalline film, in which:

a single-crystalline film is formed on a roughened-surface unformed surface, on which the roughened surface is not formed;

a crystalline film having inferior crystallinity to the single-crystalline film is formed on a roughened-surface formed surface, on which the roughened surface is formed; and further, the single-crystal substrate having a crystalline film is formed by a crystalline film including at least the single-crystalline film and the crystalline film having inferior crystallinity to the single-crystalline film, and the single-crystal substrate.

Further, in still another embodiment of the single-crystal substrate having a crystalline film according to the present invention, it is preferred that each of the single-crystalline film and the crystalline film having inferior crystallinity to the single-crystalline film be a nitride semiconductor film.

Further, in still another embodiment of the single-crystal substrate having a crystalline film according to the present invention, it is preferred that a material of the single-crystal substrate be sapphire.

Further, in still another embodiment of the single-crystal substrate having a crystalline film according to the present invention, it is preferred that roughness be formed on a surface of the single-crystalline film which is opposite to the surface facing the roughened-surface unformed surface.

Further, in still another embodiment of the single-crystal substrate having a crystalline film according to the present invention, it is preferred that side surfaces of the single-crystalline film be formed so as to be inclined at an angle which is equal to or larger than a critical angle that is determined by a refractive index of a material of the single-crystalline film and a refractive index of an atmosphere outside the single-crystalline film, provided that the critical angle is an angle with respect to a direction of a normal to the surface of the single-crystal substrate.

Further, according to the present invention, there is provided a crystalline film including the single-crystalline film and the crystalline film having inferior crystallinity to the single-crystalline film, in which a thickness of the single-crystalline film and the crystalline film having inferior crystallinity to the single-crystalline film is 300 μm or more.

According to the present invention, there is also provided a method of producing a single-crystal substrate having a crystalline film, the method including:

forming a roughened surface on at least a partial region of a surface of the single-crystal substrate used for forming the crystalline film by epitaxial growth;

then, forming by epitaxial growth a single-crystalline film on a roughened-surface unformed surface on which the roughened surface is not formed; and forming by epitaxial growth a crystalline film having inferior crystallinity to the single-crystalline film on a roughened-surface formed surface, on which the roughened surface is formed, of the single-crystal substrate, the single-crystal substrate having a crystalline film being formed by the crystalline film including at least the single-crystalline film and the crystalline film having inferior crystallinity to the single-crystalline film, and the single-crystal substrate.

Further, in an embodiment of the method of producing a single-crystal substrate having a crystalline film according to the present invention, it is preferred that the roughened surface formed on the surface of the single-crystal substrate be in a shape of any one of stripes, a cross, a lattice, a plurality of arranged polygons, concentric circles, a coil, a line symmetry with respect to a straight line passing through a center point of the single-crystal substrate, and a point symmetry with respect to the center point of the single-crystal substrate.

Further, in another embodiment of the method of producing a single-crystal substrate having a crystalline film according to the present invention, it is preferred that the roughened surface be formed on the surface of the single-crystal substrate so as to be discontinuous.

Further, in yet another embodiment of the method of producing a single-crystal substrate having a crystalline film according to the present invention, it is preferred that the roughened surface be formed over a plurality of portions which are independent of one another on the surface of the single-crystal substrate.

Further, in still another embodiment of the method of producing a single-crystal substrate having a crystalline film according to the present invention, it is preferred that the single-crystal substrate include a single-crystal substrate having a diameter of 2 inches or more.

Further, in still another embodiment of the method of producing a single-crystal substrate having a crystalline film according to the present invention, it is preferred that each of the single-crystalline film and the crystalline film having inferior crystallinity to the single-crystalline film be a nitride semiconductor film.

Further, in still another embodiment of the method of producing a single-crystal substrate having a crystalline film according to the present invention, it is preferred that a material of the single-crystal substrate be sapphire.

Further, in still another embodiment of the method of producing a single-crystal substrate having a crystalline film according to the present invention, it is preferred to further include forming roughness by etching on a surface of the single-crystalline film which is opposite to the surface facing the roughened-surface unformed surface.

Further, in still another embodiment of the method of producing a single-crystal substrate having a crystalline film according to the present invention, it is preferred that the etching be wet etching.

Further, in still another embodiment of the method of producing a single-crystal substrate having a crystalline film according to the present invention, it is preferred to further include removing at least part of the crystalline film having inferior crystallinity to the single-crystalline film by the etching to expose side surfaces of the single-crystalline film, and it is preferred that the side surfaces be formed so as to be inclined at an angle which is equal to or larger than a critical angle that is determined by a refractive index of a material of the single-crystalline film and a refractive index of an atmosphere outside the single-crystalline film, provided that the critical angle is an angle with respect to a direction of a normal to the surface of the single-crystal substrate.

Further, in still another embodiment of the method of producing a single-crystal substrate having a crystalline film according to the present invention, it is preferred that the roughened surface be formed so as to have a width of more than 0 µm and 80 µm or less.

Further, in still another embodiment of the method of producing a single-crystal substrate having a crystalline film according to the present invention, it is preferred that the roughened surface be formed so as to have a width of more than 0 µm and 10 µm or less.

Further, in still another embodiment of the method of producing a single-crystal substrate having a crystalline film according to the present invention, it is preferred that an area of the partial region in which the roughened surface is formed with respect to an entire area of the surface of the single-crystal substrate be in a range of more than 0% and 50% or less.

Further, according to the present invention, there is provided a method of producing a crystalline substrate, the method including:

after forming a mask on part of the surface of the crystalline film having inferior crystallinity to the single-crystalline film of the crystalline film produced by the method of producing a single-crystal substrate having a crystalline film, forming a second single-crystalline film on the surface of the single-crystalline film and on a surface of the mask; and forming a crystalline film having inferior crystallinity to the second single-crystalline film on the surface of the crystalline film having inferior crystallinity to the single-crystalline film and on which the mask is not formed; and after forming the second single-crystalline film and the crystalline film having inferior crystallinity to the second single-crystalline film to a predetermined thickness, repeating the steps from forming the mask to forming the single-crystalline film and the crystalline film having inferior crystallinity to the single-crystalline film to the predetermined thickness so that:

a portion where the crystalline film having inferior crystallinity to the single-crystalline film is formed is reduced every time the mask is formed; and the portion where the crystalline film having inferior crystallinity to the single-crystalline film is caused to completely disappear, thereby forming the crystalline substrate which is formed of only the single-crystalline film.

Further, according to the present invention, there is provided an element producing method of producing an element including an element portion and a single-crystal substrate having a crystalline film having a size that substantially corresponds to the element portion, the method at least including:

producing the single-crystal substrate having a crystalline film by the method of producing a single-crystal substrate having a crystalline film; and further, an element portion forming step of making the element portion, which functions as any one element selected from the group consisting of a light-emitting element, a photovoltaic element, and a semiconductor element, by carrying out at least patterning treatment on the crystalline film.

According to another embodiment of the present invention, there is also provided an element producing method of producing an element including an element portion and a crystalline substrate having a size that substantially corresponds to the element portion, the method at least including:

producing the crystalline substrate by the method of producing a crystalline substrate; and further, an element portion forming step of making the element portion, which functions as any one element selected from the group consisting of a light-emitting element, a photovoltaic element, and a semiconductor element, by carrying out at least patterning treatment on the crystalline substrate.

According to yet another embodiment of the present invention, there is also provided an element producing method of producing an element including an element portion and a single-crystal substrate having a crystalline film having a size that substantially corresponds to the element portion, the method at least including:

producing the single-crystal substrate having a crystalline film by the method of producing a single-crystal substrate having a crystalline film; and further, an element portion forming step of making the element portion, which functions as any one element selected from the group consisting of a light-emitting element, a photovoltaic element, and a semiconductor element, by carrying out at least patterning treatment on the crystalline film.

Advantageous Effects of Invention

As described above, according to the present invention, the single-crystal substrate for epitaxial growth on which a crystalline film may be formed with stress thereon being suppressed or eliminated, the single-crystal substrate having a crystalline film, the crystalline film, the method of producing a single-crystal substrate having a crystalline film, the method of producing a crystalline substrate, and the element producing method may be provided.

Note that, according to the inventions as described in claims 1, 4, 9, 10, 16, 19, and 34, the roughened-surface formed surface and the roughened-surface unformed surface are provided on the surface of the single-crystal substrate for epitaxial growth. This enables, for example, provision of a single-crystalline film portion and a crystalline film portion having inferior crystallinity to the single-crystalline film as the crystalline film to be formed. In this case, by partly providing as the crystalline film the crystalline film having inferior crystallinity to the single-crystalline film, internal stress caused in the entire crystalline film due to a difference in lattice constant and a difference in thermal expansion value with the single-crystal substrate may be relieved to the outside of the crystalline film from the crystalline film portion having inferior crystallinity to the single-crystalline film.

By relieving the internal stress to the outside of the crystalline film, the amount of warpage of the crystalline film is reduced or eliminated to improve the uniformity of the photolithography step when the respective elements are produced and to prevent development of a crack in the crystalline film. Further, according to the inventions as described in claims 5, 6, 20, and 21, the amount of warpage is reduced or eliminated, and thus, a crystalline film may be formed using a large-diameter substrate of 2 inches or more as the single-crystal substrate. Therefore, a large-diameter crystalline film of 2 inches or more may be formed in one film forming step, and thus, the mass productivity may be improved.

Further, according to the inventions as described in claims 2 and 17, by forming the pattern of a roughened-surface formed portion on the surface of the single-crystal substrate to be point-symmetric with respect to the center point of the single-crystal substrate, the internal stress may be relieved uniformly over the entire surface of the crystalline film. Further, by causing the pattern to be in the shape of stripes, in the shape of a coil, or symmetric with respect to a line, it is also possible to two-dimensionally and imbalancedly relieve the internal stress of the crystalline film.

Further, according to the inventions as described in claims 3 and 18, by forming as the pattern the roughened-surface formed portion so as to be partly intermittent to be discontinuous in a plane direction of the single-crystal substrate, when the single-crystal substrate having a crystalline film including the single-crystal substrate and the crystalline film is cut after the crystalline film is formed, the cutting may be carried out so as to obtain a straight cut off line without crossing the roughened-surface formed portion. Therefore, the division step of the single-crystal substrate having a crystalline film may be simplified, and at the same time, a single-crystalline film portion having a large area may be cut out from the crystalline film.

Further, according to the inventions as described in claims 7 and 32, by setting the width of the roughened surface to be more than 0 μm and 80 μm or less, the area occupied by the roughened surface portion on the surface of the single-crystal substrate may be reduced to inhibit reduction in the number of made elements such as light-emitting elements, photovoltaic elements, or semiconductor elements, and at the same time, after the element portion is manufactured and when the single-crystal substrate is divided into chips of elements, the roughened surface may be used as a division line. Further, according to the inventions as described in claims 8 and 33, by setting the width of the roughened surface to be more than 0 μm and 10 μm or less, the area occupied by the roughened surface portion on the surface of the single-crystal substrate may be further reduced, and thus, the area occupied by the roughened surface portion on the surface of the single-crystal substrate may be further reduced to increase the number of made elements.

Further, according to the inventions as described in claims 11, 22, and 23, by causing the single-crystalline film and the crystalline film having inferior crystallinity to the single-crystalline film to be a nitride semiconductor film, a nitride semiconductor film in which a crack is eliminated may be obtained.

Further, according to the inventions as described in claims 12, 24, and 25, it is preferred to select sapphire ($Al_2O_3$) as a material of the single-crystal substrate when the crystalline film is GaN, because there is an effect that, as the thickness of the GaN film increases, the lattice constant of the single-crystal substrate gradually changes to relax the stress.

Further, according to the inventions as described in claims 13, 26, and 27, by causing a surface of the single-crystalline film which is opposite to the surface facing the roughened-surface unformed surface in the single-crystal substrate having a crystalline film to be rough, the light extraction efficiency of a light-emitting element such as an LED may be improved.

Further, according to the inventions as described in claims 28 and 29, by selecting wet etching as a method of forming the rough shape on the surface of the single-crystalline film, low cost processing may be performed and damage to the surface of the single-crystal substrate may be suppressed.

Further, according to the inventions as described in claims 14, 30, and 31, by forming side surfaces of the single-crystalline film so as to be inclined at an angle which is equal to or larger than a critical angle and causing light having an incident angle which is equal to or larger than the critical angle to be reflected by the side surfaces of the single-crystalline film and by the surface of the single-crystalline film several times, the probability of extracting the light to the outside may be improved.

Further, according to the invention as described in claim 15, by forming the crystalline film by epitaxial growth to a thickness of 300 μm or more with which the crystalline film can stand on its own, a crystalline film having a thickness with which the crystalline film can stand on its own and having no crack may be obtained.

Further, according to the inventions as described in claims 35, 36, 37, and 38, by producing a crystalline substrate from the crystalline film according to the present invention, using the crystalline substrate or the single-crystal substrate having a crystalline film to make an element portion, and using the element portion to obtain any one element of a light-emitting element, a photovoltaic element, and a semiconductor element, various kinds of elements with improved quality and yield may be provided.

BRIEF DESCRIPTION OF DRAWINGS

FIG. 8 Side views schematically illustrating a making process of a crystalline film made using the single-crystal substrate according to the embodiment of the present invention, in which

FIG. 9 Side views schematically illustrating a making process of a crystalline substrate made using the crystalline film made by the process illustrated in FIG. 8, in which

DESCRIPTION OF EMBODIMENTS

Figure 1A:
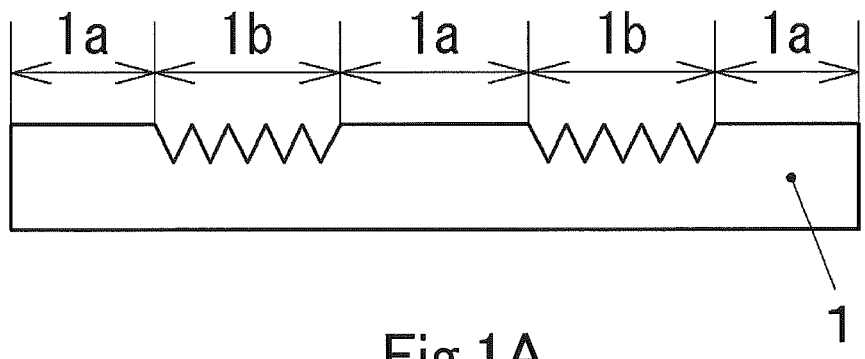
FIG. 1 Schematic views illustrating an exemplary single-crystal substrate according to an embodiment of the present invention, in which FIG. 1 (A) is a side view of the single-crystal substrate and FIG. 1 (B) is a side view of a single-crystal substrate having a crystalline film according to the embodiment of the present invention made using the single-crystal substrate illustrated in FIG. 1 (A).

A single-crystal substrate for epitaxial growth, a single-crystal substrate having a crystalline film, and methods of producing the same according to an embodiment of the present invention are described in the following with reference to FIGS. 1 to 8. FIG. 1(A) is a side view schematically illustrating a single-crystal substrate for epitaxial growth (hereinafter referred to as "single-crystal substrate") according to the present invention. A single-crystal substrate 1 illustrated in FIG. 1(A) is used for forming a film having crystallinity (hereinafter referred to as "crystalline film"), and a roughened surface (rough surface) 1b is formed on its crystal growth surface, that is, at least part of one surface of the single-crystal substrate 1. In this case, it is preferred that the roughened surface 1b be partly formed at a proportion of more than 0% and 50% or less of the entire area of the crystal growth surface.

The crystal growth surface as used herein means a surface having a surface roughness Ra of 1 nm or less of the single-crystal substrate before the roughened surface 1b is formed thereon. The crystal growth surface is normally provided only on one surface of the single-crystal substrate. Note that, the surface roughness Ra of the crystal growth surface is preferably 0.1 nm or less, and, as the surface roughness Ra becomes smaller, it is more preferred. Further, the roughened surface as used herein means a portion of the surface of the single-crystal substrate 1 which is processed to have a surface roughness Ra of 100 nm or more. The roughened surface 1b is partly formed on the surface of the single-crystal substrate 1 by, for example, blasting treatment or etching treatment. Note that, the surface roughness Ra of the roughened surface 1b is not specifically limited insofar as it is 100 nm or more, but it is preferred that the surface roughness Ra of the roughened surface 1b be in a range of 500 nm to 2,000 nm.

Note that, the surface roughness Ra as used herein means the arithmetic mean of the roughness determined according to JIS B 0601-2001, and means a value measured using an atomic force microscope (AFM) under the following conditions:
 measurement mode: dynamic force mode or tapping mode
 measurement area: 4 μm per side
 diameter of cantilever tip: 10 nm or less
 number of scan lines: 512 (512 lines for every 4 μm)
 scan rate: 0.3 Hz (0.3 seconds per line)

Figure 1B:
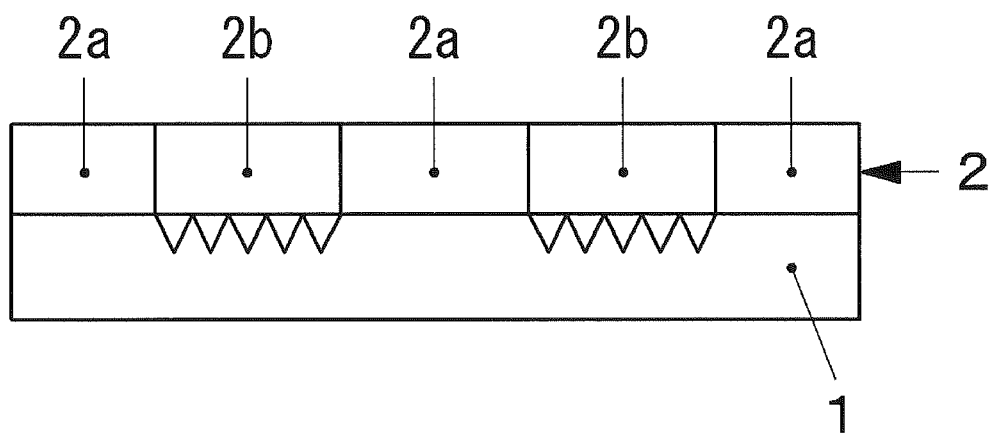

Further, as illustrated in FIG. 1(B), a crystalline film 2 is formed by epitaxial growth on the crystal growth surface of the single-crystal substrate 1. A film having single crystallinity (hereinafter referred to as "single-crystalline film") 2a is formed on a surface of the single-crystal substrate 1 on which the roughened surface 1b is not formed (roughened-surface unformed surface 1a), while a crystalline film, having crystallinity lower than the single-crystalline film 2a (hereinafter simply referred to as "inferior crystalline film" as necessary) 2b is formed on the roughened-surface formed surface (1b in FIG. 1(A)) of the single-crystal substrate 1. Note that, according to the present invention, whether the crystallinity is superior or inferior is defined as follows. When the same group of atoms or molecules in a state of being three-dimensionally arranged with certain regularity is caused to be in a more disordered state with respect to a point, a line, or a plane, the state is referred to as a state in which the crystallinity is inferior. Specifically, when the inferior crystalline film 2b is referred to, it is meant that the three-dimensional arrangement of the group of atoms or molecules therein is in a more disordered state than that in the single-crystalline film 2a with respect to a point, a line, or a plane. Examples of the single-crystalline film 2a and the inferior crystalline film 2b include a nitride semiconductor film, and more specifically, include group III nitride-based compound semiconductors represented by a GaN-based semiconductor. Note that, examples of the inferior crystalline film 2b include a poly-crystal film.

By providing both the roughened surface 1b formed surface and the roughened-surface unformed surface (smooth surface) 1a on the surface of the single-crystal substrate 1 in this way, it is also possible to provide both the single-crystalline film 2a portion and the inferior crystalline film 2b portion in the crystalline film 2 to be formed. By partly providing the inferior crystalline film 2b in the crystalline film 2 in this way, internal stress caused in the entire crystalline film 2 due to a difference in lattice constant and a difference in thermal expansion value with the single-crystal substrate 1 may be relieved to the outside of the crystalline film 2 from the inferior crystalline film 2b portion. Therefore, the amount of warpage of the crystalline film 2 is reduced or eliminated, the uniformity of the photolithography step when the respective elements are produced is improved in comparison with a conventional case, and development of a crack in the crystalline film 2 is prevented. It is basically desired that the amount of warpage be reduced so that the crystalline film 2 becomes as close as possible to a flat state, but it is acceptable that the direction of warpage of the single-crystal substrate 1 and the direction of the warpage of the crystalline film 2 due to the formation of the crystalline film 2 remain the same and the extent of the warpage becomes smaller to some extent.

Further, reduction or elimination of the amount of warpage enables formation of the crystalline film 2 by using a large-diameter substrate of 2 inches or more on the single-crystal substrate 1, and thus, a large-diameter crystalline film of 2 inches or more may be formed by one film forming step. Therefore, the mass productivity may be improved. Note that, the amount of warpage according to the present invention means the distance between a peripheral portion and a center portion of the single-crystal substrate 1 or the crystalline film 2 in a thickness direction of the single-crystal substrate 1 and the crystalline film 2.

Further, by causing the single-crystalline film 2a and the inferior crystalline film 2b to be a nitride semiconductor film, a nitride semiconductor film in which a crack is eliminated may be obtained.

It is preferred to select sapphire ($Al_2O_3$) as a material of the single-crystal substrate 1 when the crystalline film 2 is GaN, because there is an effect that, as the thickness of the GaN film increases, the lattice constant of the single-crystal substrate 1 gradually changes to relax the stress.

The reason that it is preferred to set the area in which the roughened surface 1b is formed with respect to the entire area of the crystal growth surface of the single-crystal substrate 1 to be more than 0% and 50% or less is, if the proportion exceeds 50%, the area of the single-crystalline film 2a becomes smaller than the area of the inferior crystalline film 2b and the efficiency of forming the crystalline film 2 having single crystallinity is lowered, which is not desired. Further, the reason that the proportion is set to be more than 0% is, if the proportion is set to include 0%, a case in which the single-crystal substrate 1 does not have the roughened surface 1b formed on the crystal growth surface thereof is also within the scope of the present invention. In order that the roughened surface 1b is formed without fail on the crystal growth surface to relieve internal stress of the crystalline film 2 to the outside, the proportion is set to be more than 0%.

The crystal growth surface of the single-crystal substrate 1 is polished in advance before the roughened surface 1b is formed thereon. It is enough that the polishing is carried out to the extent that the crystal growth surface becomes smooth enough to enable epitaxial growth thereon. As a guideline for enabling the epitaxial growth, it is preferred that the formation be carried out so that the surface roughness Ra is 1 nm or less.

Figure 2:
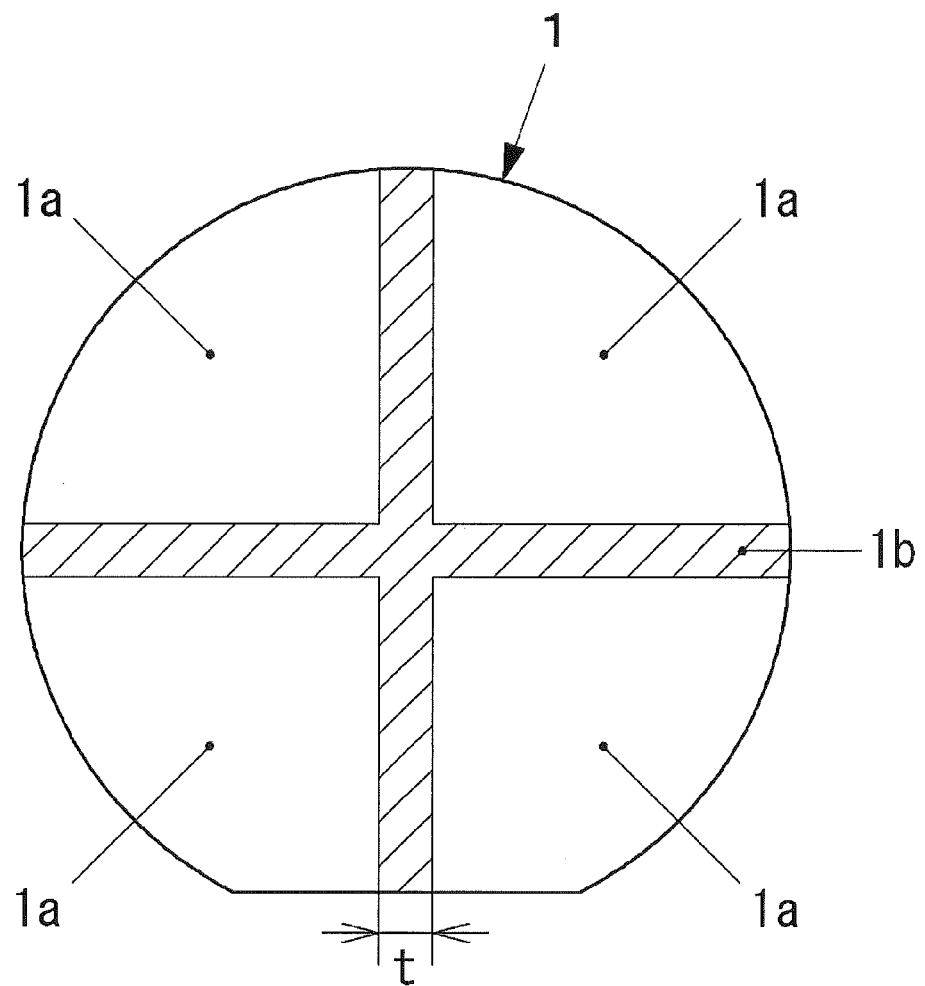
FIG. 2 A plan view of the single-crystal substrate illustrating an exemplary shape of a roughened surface on the surface of the single-crystal substrate according to the embodiment of the present invention.
Figure 3:
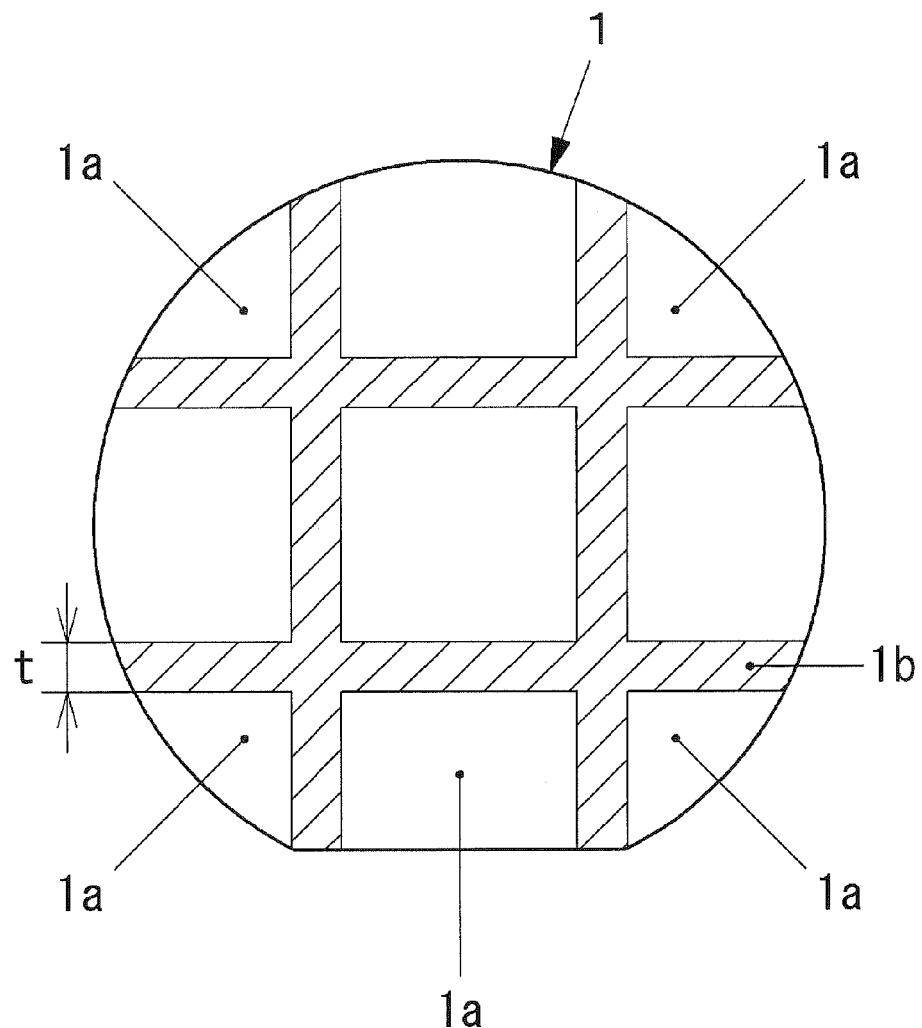
FIG. 3 A plan view of the single-crystal substrate illustrating another exemplary shape of the roughened surface on the surface of the single-crystal substrate according to the embodiment of the present invention.
Figure 4:
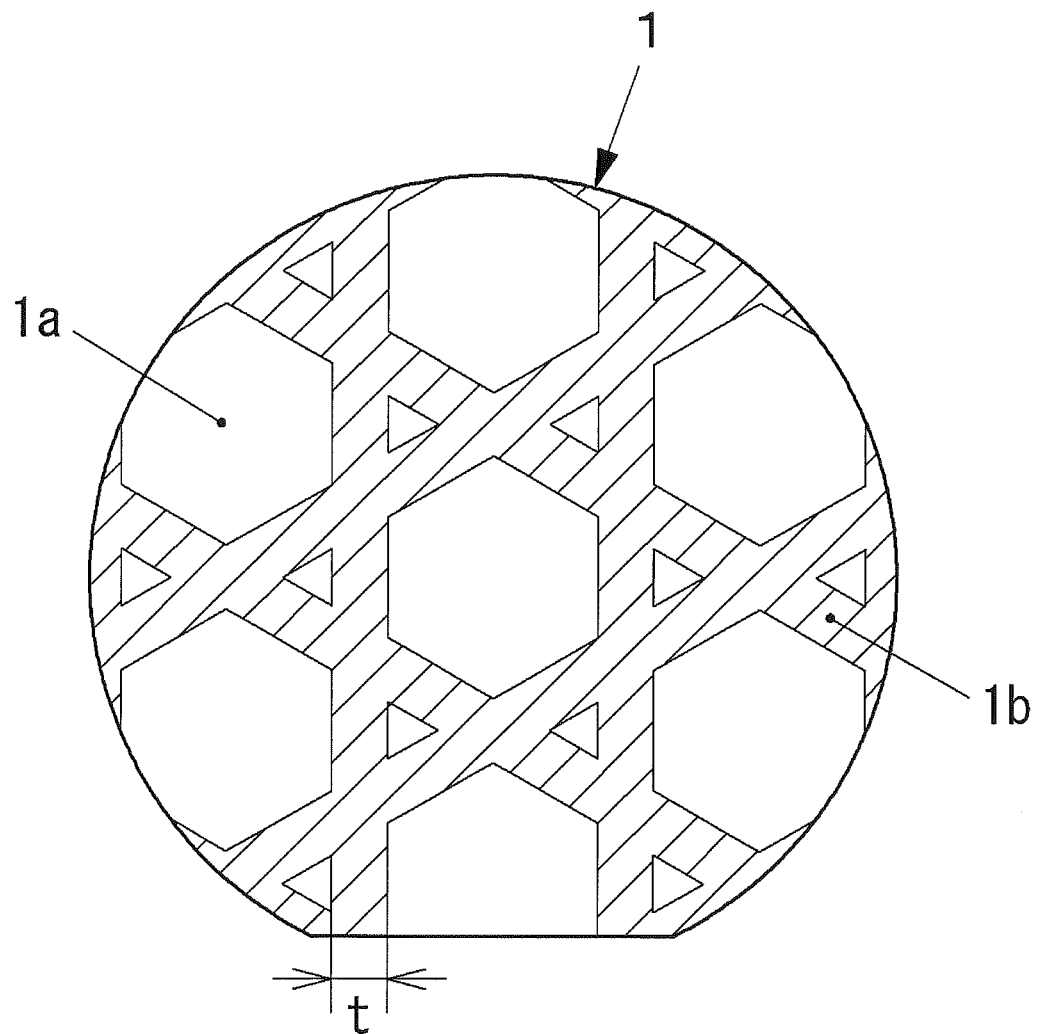
FIG. 4 A plan view of the single-crystal substrate illustrating still another exemplary shape of the roughened surface on the surface of the single-crystal substrate according to the embodiment of the present invention.

A pattern of the portion in which the roughened surface 1b is formed on the surface of the single-crystal substrate 1 is, for example, in the shape of a cross as illustrated in FIG. 2 in which portions each having the roughened surface 1b formed therein in the shape of a single line are arranged so as to be perpendicular to and in parallel to the orientation flat surface of the single-crystal substrate 1, respectively, in the shape of a lattice as illustrated in FIG. 3 in which a plurality of roughened surfaces 1b each in the shape of a single line are arranged so as to be perpendicular to and in parallel to the orientation flat surface, respectively, in the shape of a plurality of arranged polygons formed by a plurality of roughened surfaces 1b each in the shape of a single line as illustrated in FIG. 4 (in FIG. 4, hexagons), in the shape of a plurality of ring-shaped portions in which the roughened surface 1b are formed, in the shape of concentric circles arranged with the center point of the surface of the single-crystal substrate 1 being the center, or the like.

The shape of the pattern affects the symmetry of the warped state of the crystalline film 2, and thus, when internal stress is required to be released uniformly over the entire surface of the crystalline film 2, it is preferred that the shape in plan view of the shape of the pattern be point-symmetric with respect to the center point of the single-crystal substrate 1 as illustrated in FIG. 2 to FIG. 4 or in the shape of concentric circles.

Note that, the shape of the pattern is not limited to these patterns. Taking into consideration the amount of warpage or the shape of warpage of the crystalline film 2, the pattern may be in the shape of stripes in which a plurality of roughened surfaces each in the shape of a single line are formed so as to be perpendicular to the orientation flat surface of the single-crystal substrate 1, in the shape of a coil in which a roughened surface is formed helically, or in a pattern which is line-symmetric with respect to a straight line passing through the center point of the single-crystal substrate 1. With a pattern in the shape of stripes, in the shape of a coil, or symmetric with respect to a line, it is also possible to two-dimensionally imbalancedly relieve the internal stress of the crystalline film 2.

Figure 5:
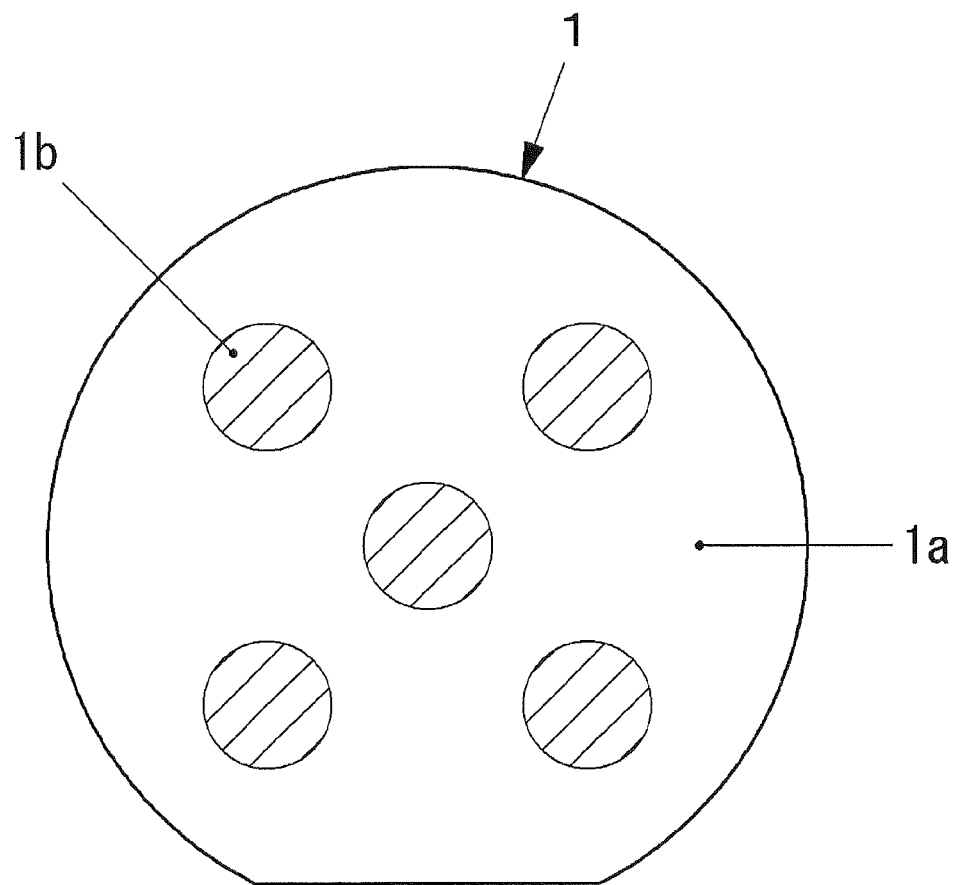
FIG. 5 A plan view of the single-crystal substrate illustrating yet another exemplary shape of the roughened surface on the surface of the single-crystal substrate according to the embodiment of the present invention.

Alternatively, as illustrated in FIG. 5, the portions in which the roughened surface 1b are formed on the surface of the single-crystal substrate 1 may be formed as a plurality of circular portions which are independent of one another. In the case of the shape of the pattern illustrated in FIG. 5, it is preferred that the portions in which roughened surface 1b are formed are formed so as not to be apparently imbalancedly formed in the plane direction of the single-crystal substrate 1 from the viewpoint of uniformly relaxing or eliminating the internal stress over the entire surface of the crystalline film 2. Therefore, as illustrated in FIG. 5, it is preferred that the shape of the pattern in plan view be point-symmetric with respect to the center point of the single-crystal substrate 1.

When the single-crystal substrate 1 on which the crystalline film 2 is to be formed is sapphire, it is preferred that its crystal growth surface be the C-plane, but the plane is not limited thereto, and planes other than the C-plane such as the R-plane, the M-plane, and the A-plane may also be used. Note that, the crystal growth surface may be slightly slanted with respect to the C-plane. The direction of the slant of the crystal growth surface with respect to the C-plane may be the direction of the m axis or the direction of the a axis, but the direction of the slant is not limited thereto.

Figure 6:
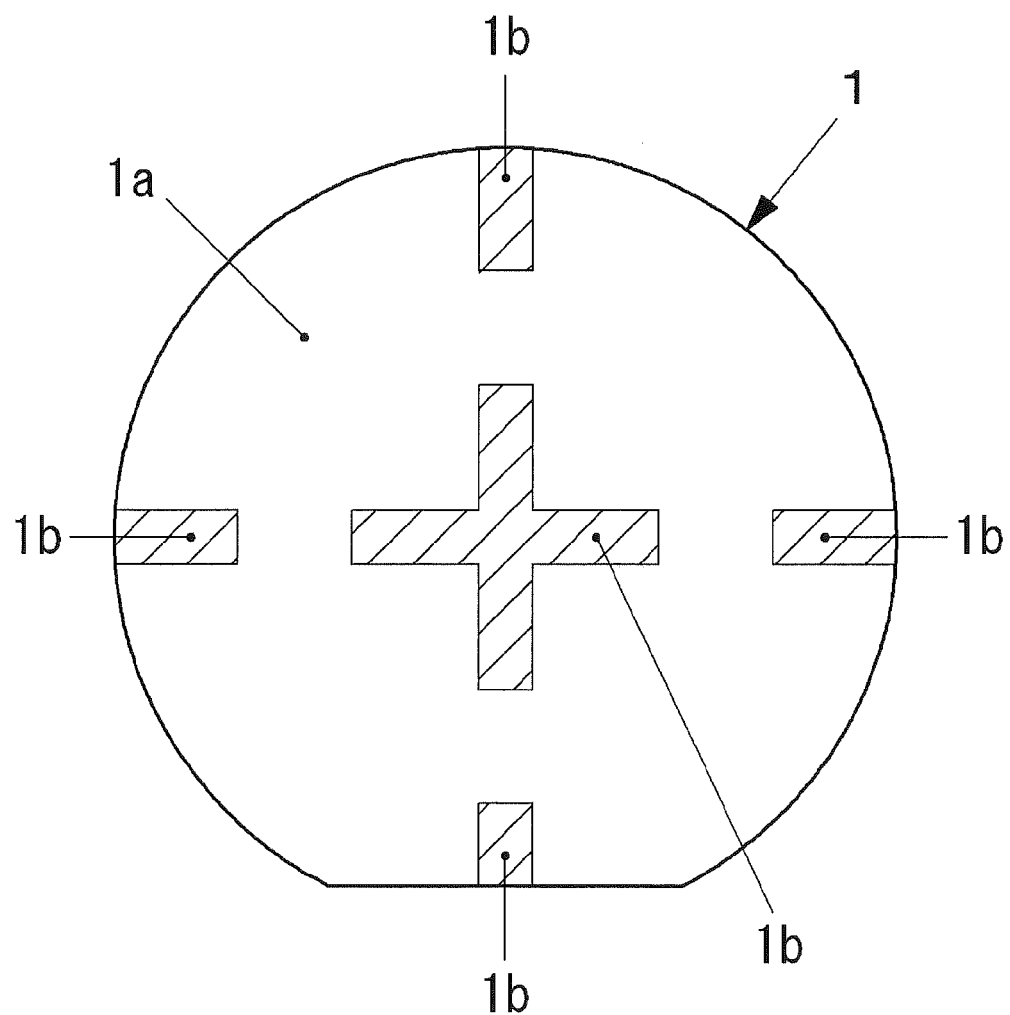
FIG. 6 A plan view of the single-crystal substrate illustrating a further exemplary shape of the roughened surface on the surface of the single-crystal substrate according to the embodiment of the present invention.

Further, as the shape of the pattern, as illustrated in FIG. 6, the portion in which the roughened surface 1b is formed may be formed so as to be partly intermittent to be discontinuous in the plane direction of the single-crystal substrate 1. In FIG. 6, a pattern of forming the roughened surface 1b is illustrated in which the pattern in the shape of a cross illustrated in FIG. 2 is discontinuous.

Figure 7:
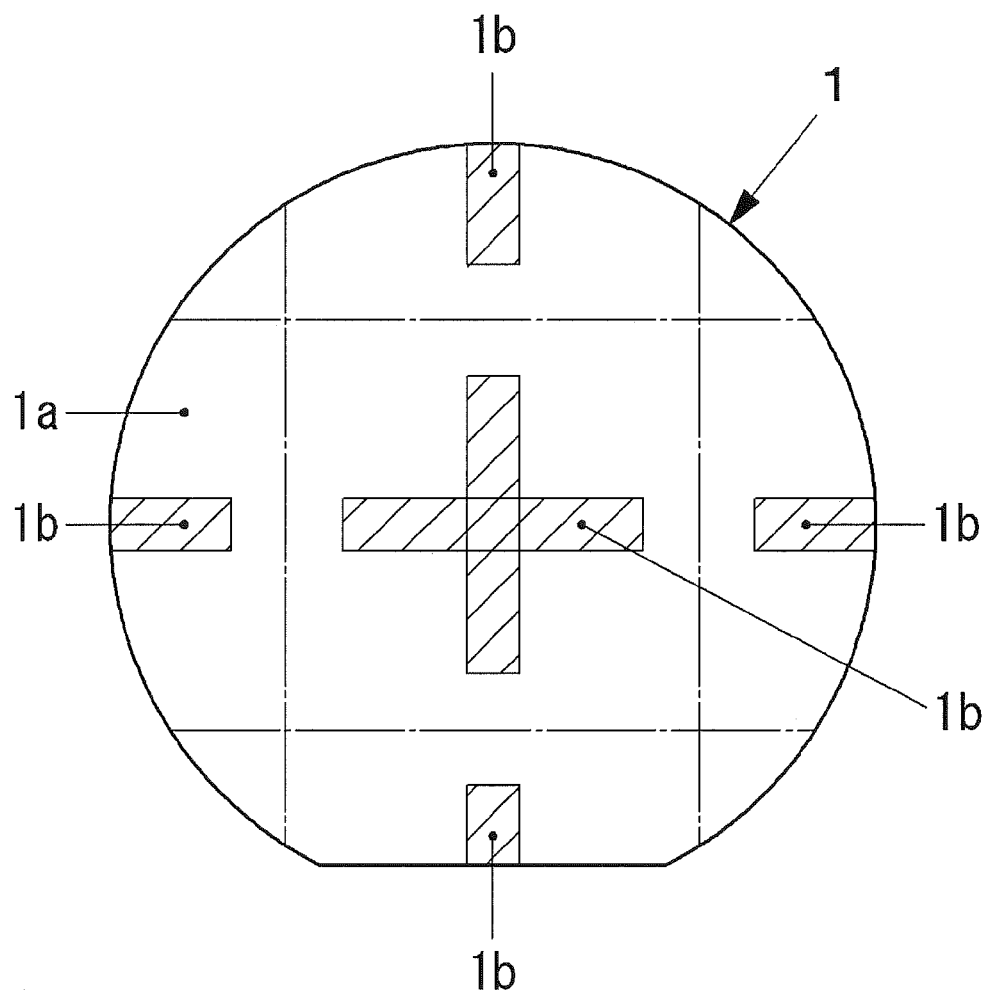
FIG. 7 A plan view of the single-crystal substrate illustrating a cut state of the single-crystal substrate illustrated in FIG. 6.

As illustrated in FIG. 6, by forming the portion in which the roughened surface 1b is formed so as to be discontinuous, when the single-crystal substrate having a crystalline film including at least the single-crystal substrate 1 and the crystalline film 2 is cut after the crystalline film 2 is formed, as indicated by dot-and-dash lines in FIG. 7, the cutting may be carried out with the cut off line being straight without crossing the portion in which the roughened surface 1b is formed. Therefore, the division step of the single-crystal substrate having a crystalline film may be simplified, and at the same time, the portion of the single-crystalline film 2a having a large area may be cut out from the crystalline film 2. Note that, the discontinuous shape of the pattern may be based on not only the shape of a cross as illustrated in FIG. 6, but also the shapes of the patterns illustrated in FIG. 3 and FIG. 4, the shape of stripes, the shape of concentric circles, the shape of a coil, and shapes symmetric with respect to a line or a point.

Further, a width t of the portion in which the roughened surface 1b is formed (see FIG. 2 to FIG. 4) is set so that a crack does not develop in the crystalline film 2, which is caused when the proportion of the area in which the roughened surface 1b is formed to the entire area of the surface of the single-crystal substrate 1 (crystal growth surface) is reduced so much that it is difficult to sufficiently relieve the internal stress of the crystalline film 2 to the outside to cause the amount of warpage of the crystalline film 2 to be excessive.

Note that, the upper limit of the width t is a dimension with which, when the diameter of the single-crystal substrate 1 is enlarged, an area which is equal to or larger than the area of the roughened-surface unformed surface 1a before the diameter of the single-crystal substrate 1 is enlarged may be secured.

By setting the width t to be more than 0 µm and 80 µm or less, the area occupied by the portion of the roughened surface 1b on the surface of the single-crystal substrate 1 may be reduced to inhibit reduction in the number of made elements such as light-emitting elements, photovoltaic elements, or semiconductor elements, and at the same time, after the element portion is made and when the single-crystal substrate is divided into chips of elements, the roughened surface 1b may be used as a cut off line. Further, by setting the width t to be more than 0 µm and 10 µm or less, the area occupied by the portion of the roughened surface 1b portion on the surface of the single-crystal substrate 1 may be further reduced, and thus, the area occupied by the portion of the roughened surface 1b on the surface of the single-crystal substrate 1 may be reduced to increase the number of made elements, which is more preferred.

Next, a method of producing a single-crystal substrate having a crystalline film according to the present invention is described with reference to FIG. 8. First, the crystal growth surface of the single-crystal substrate is polished. It is enough that the polishing is carried out to the extent that the crystal growth surface becomes smooth enough to enable epitaxial growth thereon. As a guideline for enabling the epitaxial growth, it is preferred that the formation be carried out so that the surface roughness Ra is 1 nm or less.

Figure 8A:
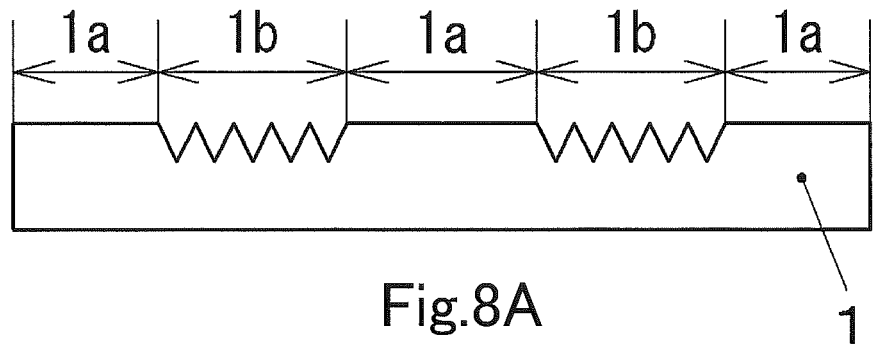
FIG. 8(A) is a view illustrating the single-crystal substrate having the roughened-surface formed surface and a roughened-surface unformed surface provided thereon, FIG. 8 (B) is a view illustrating a state in which the crystalline film is provided on the surface of the single-crystal substrate illustrated in FIG. 8(A)

Further, the single-crystal substrate is thermally cleaned. Then, as illustrated in FIG. 8(A), the roughened surface 1b is formed on the surface of the crystal growth surface under a state in which the proportion of the roughened surface 1b is more than 0% and 50% or less of the entire area of the crystal growth surface of the single-crystal substrate 1. The roughened surface 1b is formed using blasting treatment or etching treatment. Description in more detail is made taking blasting treatment as an example. First, the crystal growth surface is masked, and blasting treatment is carried out selectively only with regard to the portion in which the roughened surface 1b is formed to form the roughened surface 1b on the crystal growth surface. As a material to be ejected, a polishing material which is a material such as alumina or silicon carbide having an average particle size of 5 to 40 µm is used. In the blasting treatment, the treatment proceeds on the order of submicrometers at which the amount of heat generated is small, and thus, chipping of the single-crystal substrate 1, a crack in the single-crystal substrate 1, and the like may be extremely reduced. Therefore, the blasting treatment is suitable as a method of forming the roughened surface 1b. After the blasting treatment, in order to remove the material ejected onto the crystal growth surface, the crystal growth surface is cleaned.

It is preferred that, taking into consideration of the crystal growth of the inferior crystalline film 2b, the surface roughness Ra of the portion in which the roughened surface 1b is formed be set in a range of about 100 nm or more.

A method of setting the width t to be more than 0 µm and 80 µm or less is described below. First, a single-crystal substrate having no portion of the roughened surface 1b formed on one surface thereof is prepared. Then, a masking film such as an SiO₂ film or an Ni film is formed on the surface of the substrate by a vapor phase film forming method of various kinds including the sputtering method and the chemical vapor deposition (CVD) method or a liquid phase film forming method of various kinds including the spin coating method, the plating method, and the sol-gel method, and further, a positive resist film is formed and laminated on the masking film by spin coating.

Then, a mask aligner is used to pattern the resist film by photolithography. The shape of the pattern here is the shape of the pattern of the roughened surface 1b, and thus, the width of the shape of the pattern of the resist film is set to be, for example, more than 0 µm and 80 µm or less (more preferably, more than 0 µm and 10 µm or less). Then, the mask aligner is used to transfer the shape of the pattern onto the masking film (the resist film is exposed and developed). Then, after the masking film is patterned by etching, further, the resist film is removed. Further, by carrying out etching with the patterned masking film being used as the mask material, the roughened surface 1b is formed on the surface of the single-crystal substrate along the shape of the pattern. After that, the masking film is removed.

Note that, in the etching treatment of the masking film and the surface of the single-crystal substrate, both of dry etching and wet etching may be used. Compared with dry etching, wet etching may form the roughened surface 1b of the single-crystal substrate at a lower cost, and may control damage to the surface of the single-crystal substrate more compared with the case of dry etching. Therefore, from the viewpoint of enabling low cost treatment and controlling damage to the surface of the single-crystal substrate, it is preferred to select wet etching treatment as the etching treatment. On the other hand, in wet etching, undercut is liable to occur, but dry etching may carry out treatment under the conditions of causing no undercut. Therefore, dry etching is more excellent in controlling the width of the roughened surface than wet etching. Therefore, from the viewpoint of securing controllability of the width of the roughened surface, it is preferred to select dry etching treatment as the etching treatment.

Next, the crystalline film 2 is formed by epitaxial growth on the crystal growth surface of the single-crystal substrate 1 having the roughened surface 1b formed thereon. When the pattern of the roughened surface 1b is in the shape of a cross or in the shape of a lattice, an n-GaN-based layer and an InGaN-based active layer having a multiquantum well structure are grown so as to be laminated as the crystalline film 2. Further, when the shape of the pattern of the roughened surface 1b is as illustrated in FIG. 5, GaN is grown as the crystalline film 2. When the n-GaN-based layer and the InGaN-based active layer are grown, a buffer layer is formed in advance on the crystal growth surface of the single-crystal substrate 1.

Figure 8B:
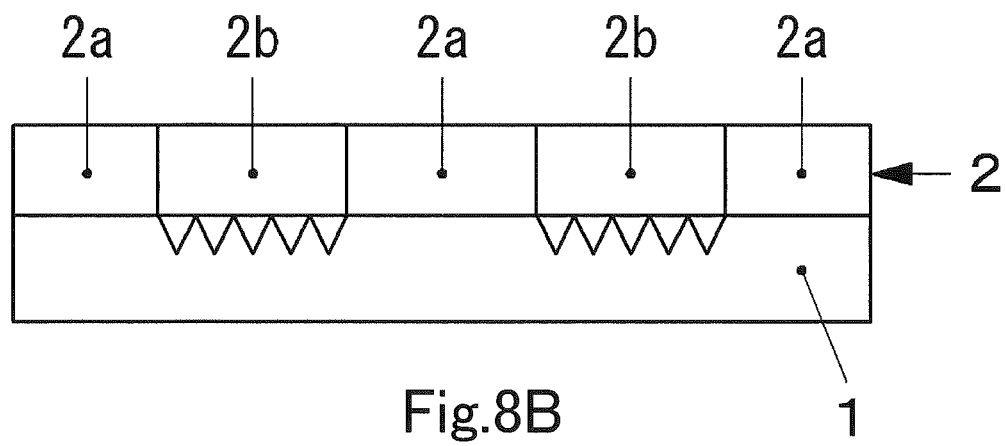

As the method of epitaxially growing the crystalline film 2 on the single-crystal substrate having the roughened surface 1b whose pattern is in the shape of a cross or in the shape of a lattice, the metal organic chemical vapor deposition (MOCVD) method is preferred. The reason is that the crystalline film 2 is required to be formed and laminated with the composition thereof being changed between the n-GaN-based layer and the In—GaN-based active layer, and, in the MOCVD method, the composition of the crystalline film is more easily changed during the epitaxial growth. The n-GaN-based layer and the InGaN-based active layer are formed and laminated by the MOCVD method, and further, with regard to the n-GaN-based layer and the InGaN-based active layer, the inferior crystalline film 2b is formed on the roughened surface 1b formed surface and the single-crystalline film 2a is formed on the roughened-surface unformed surface 1a. In FIG. 8(B), the n-GaN-based layer and the InGaN-based active layer are collectively referred to as the crystalline film 2.

On the other hand, as the method of epitaxially growing GaN having a thickness with which the film can stand on its own, the hydride vapor phase epitaxy (HVPE) method is preferred. The reason is that the film may be formed without performing a complicated process, a growth rate which is higher than those of the MOCVD method and the molecular beam epitaxy (MBE) method may be attained and thick GaN may be grown, and the method is excellent in reducing the defect density of GaN and in mass productivity. By the HVPE method, the inferior crystalline film 2b is formed on the roughened surface 1b formed surface and the single-crystalline film 2a is formed on the roughened-surface unformed surface 1a, and the crystalline film 2 having a thickness of 300 µm or more with which the film can stand on its own is grown and formed (see FIG. 8(B)).

Figure 10:
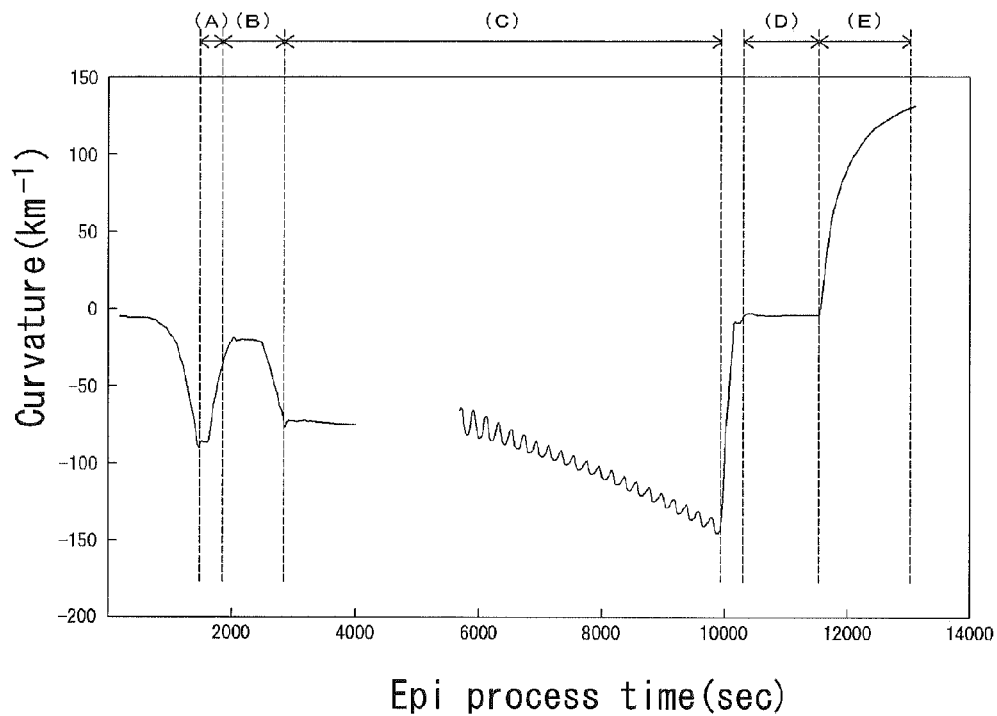
FIG. 10 A graph showing exemplary curvature behavior of the single-crystal substrate in a step of forming a buffer layer and the crystalline film.

FIG. 10 is a graph showing exemplary curvature behavior of the single-crystal substrate in a step of forming a buffer layer and the crystalline film 2. Specifically, a sapphire substrate is used as the single-crystal substrate 1 (hereinafter referred to as "sapphire substrate 1S" as necessary), and FIG. 10 is a graph showing the curvature behavior of the sapphire substrate 1S during the formation of the buffer layer and the crystalline film 2 on the crystal growth surface of the sapphire substrate 1S having the roughened surface 1b formed thereon whose pattern is in the shape of a cross illustrated in FIG. 2 with the width t of 0.5 mm. As the crystalline film 2, a crystalline film formed by laminating an n-GaN-based layer and an In—GaN-based active layer is described as an example. In FIG. 10, the horizontal axis represents time while the vertical axis represents the curvature of the sapphire substrate 1S on the crystal growth surface. Note that, the positive direction of the vertical axis represents a state in which the sapphire substrate 1S is warped with the crystal growth surface side thereof being convex, while the negative direction of the vertical axis represents a state in which the sapphire substrate 1S is warped with the crystal growth surface side thereof being concave.

Note that, the curvature behavior of the sapphire substrate 1S during the step of forming the buffer layer and the crystalline film (hereinafter simply referred to as "film forming step" as necessary) as illustrated in FIG. 10 may be grasped by using the in-situ observation method.

Figure 13:
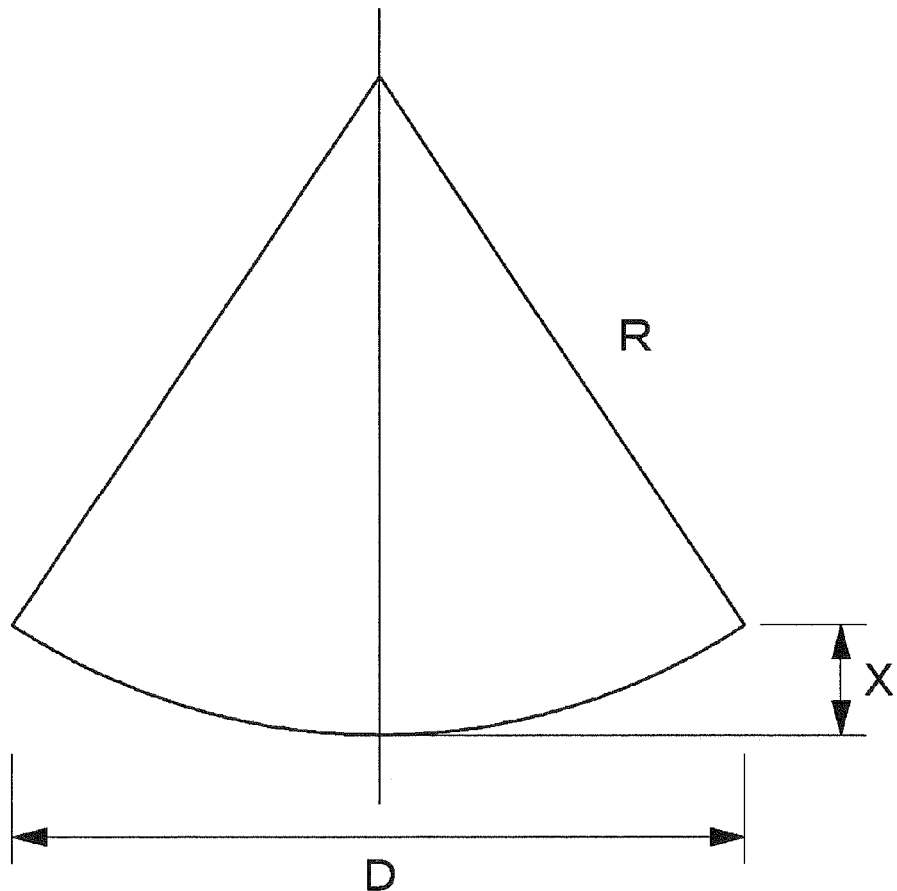
FIG. 13 A schematic explanatory diagram illustrating a method of calculating the amount of warpage of the single-crystal substrate having a crystalline film from the curvature of the single-crystal substrate having a crystalline film.
Figure 14:
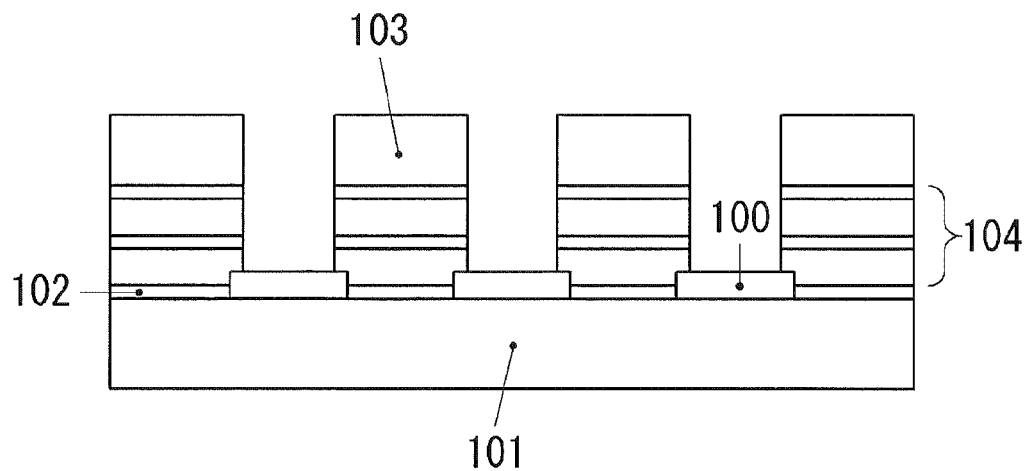
FIG. 14 A sectional view illustrating an exemplary conventional method of producing a nitride semiconductor film.

FIG. 13 is a schematic explanatory diagram illustrating a method of calculating the amount of warpage of the single-crystal substrate 1 having the crystalline film 2 from the curvature of the single-crystal substrate 1 having the crystalline film 2. In FIG. 13, R is the radius of curvature of the single-crystal substrate 1 having the crystalline film 2, X is the amount of warpage of the single-crystal substrate having the crystalline film 2 which has a curvature of 1/R, and D is the approximate diameter of the single-crystal substrate 1 having the crystalline film 2. Using the Pythagorean theorem, the relationship of these values may be expressed as $(1/R)^2 = ((1/R) - X)^2 + (D/2)^2$. From this equation, when the diameter of the single-crystal substrate 1 is 2 inches (50 mm), the amount of warpage (µm) may be determined as $0.322 \times$ curvature (km$^{-1}$), and, when the diameter of the single-crystal substrate 1 is 4 inches (100 mm), the amount of warpage (µm) may be determined as $1.250 \times$ curvature (km$^{-1}$).

Further, sections denoted as (A) to (E) along the horizontal axis in FIG. 10 correspond to process steps, respectively, which are performed in sequence in the film forming step. In this case, the process step (A) corresponds to the process step of thermally cleaning the crystal growth surface of the sapphire substrate 1S, the process step (B) corresponds to the process step of forming the buffer layer, the process step (C) corresponds to the process step of forming the n-GaN-based layer, the process step (D) corresponds to the process step of forming the InGaN-based active layer, and the process step (E) corresponds to the process step of carrying out cooling.

Next, change in curvature behavior of the sapphire substrate 1S shown in FIG. 10 is described. First, in the process step (A) of thermally cleaning the crystal growth surface, due to the temperature difference between the crystal growth surface and the other non-crystal growth surface of the two surfaces of the sapphire substrate 1S, warpage is caused in a direction in which the crystal growth surface side is concave (in the negative side of the vertical axis in FIG. 10) and the curvature greatly changes.

Then, in the process step (B) of forming the buffer layer, the temperature of the sapphire substrate 1S is lowered from the temperature during the process step (A) of thermally cleaning the crystal growth surface, and normally, is held at a temperature of about 500 to 600° C. Therefore, warpage is caused in a direction in which the crystal growth surface side is convex (in the positive side of the vertical axis in FIG. 10), and the absolute value of the curvature becomes smaller.

Then, in the process step (C) of forming the n-GaN-based layer, the temperature of the sapphire substrate 1S is again raised to about 1,000° C., and the n-GaN layer is formed. In this process step, due to the difference in lattice constant between gallium nitride and sapphire, warpage is caused in the direction in which the crystal growth surface side is concave, and the absolute value of the curvature increases. As the film formation proceeds and the film thickness becomes larger, the absolute value of the curvature becomes larger.

Then, in the process step (D) of forming the InGaN-based active layer, the temperature of the sapphire substrate 1S is lowered to about 700 to 800° C., and the InGaN-based active layer is formed. When a light-emitting element such as an LED chip is produced by using the sapphire substrate 1S having the crystalline film 2 and performing predetermined postprocessing, the uniformity of the thickness of the InGaN-based active layer and the In composition in the InGaN-based active layer affects the in-plane uniformity of the wavelength of the emitted light, and further, affects the production yield of the light-emitting element. The uniformity of the thickness of the InGaN-based active layer and the In composition in the InGaN-based active layer is affected by the film formation temperature. Therefore, in the process step (D) of forming the InGaN-based active layer, in order to improve the in-plane uniformity of the temperature of the sapphire substrate 1S, it is desired to set the curvature of the sapphire substrate 1S during the layer formation to be as close to zero as possible. Note that, in the example shown in FIG. 10, the curvature in the process step (D) is held close to almost zero.

Next, in the process step (E) of carrying out cooling of the sapphire substrate 1S having the buffer layer and the crystalline film 2 formed thereon, due to the difference in thermal expansion coefficient between the buffer layer and the crystalline film 2 and the sapphire substrate 1S, the sapphire substrate 1S is warped in the direction in which the crystal growth surface side is convex, and the absolute value of the curvature increases. Further, in the process of carrying out cooling to a temperature in proximity to room temperature, compressive stress is caused in the buffer layer and in the crystalline film 2, and thus, in order to release the compressive stress, the state in which the sapphire substrate 1S is warped in the direction in which the crystal growth surface side is convex is maintained even after the cooling is carried out.

Figure 8C:
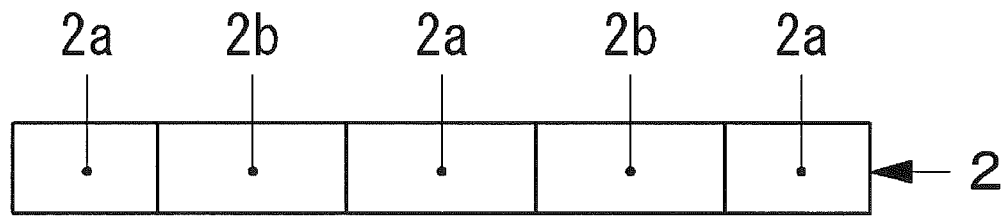
FIG. 8(C) is a view illustrating a state in which the crystalline film is separated from the single-crystal substrate having the crystalline film provided thereon illustrated in FIG. 8(B).

Further, when the crystalline film 2 is GaN having a thickness of 300 μm or more with which the film can stand on its own, the crystalline film 2 is peeled and separated from the single-crystal substrate 1 more (see FIG. 8(C)). By forming by epitaxial growth the crystalline film 2 to a thickness of 300 μm or more with which the film can stand on its own, the crystalline film 2 which is a thick film may be formed when the separation is made. Therefore, the crystalline film 2 having a thickness of 300 μm or more and having no crack may be obtained.

Figure 15:
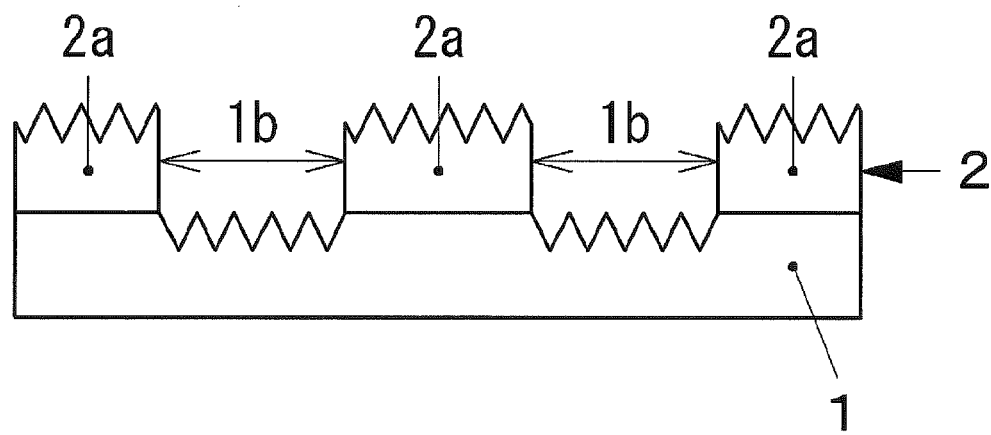
FIG. 15 A side view illustrating an exemplary modification of the single-crystal substrate having a crystalline film according to the embodiment of the present invention.

As illustrated in FIG. 15, in the single-crystal substrate 1 having the crystalline film 2, roughness may be formed on a surface of the single-crystalline film 2a which is opposite to the surface facing the roughened-surface unformed surface 1a. By roughing the surface of the single-crystalline film 2a, the light taking out efficiency of a light-emitting element such as an LED may be improved.

Etching is an exemplary applicable method of forming a rough shape on the surface of the single-crystalline film 2a. As the etching treatment, it is possible to use dry etching, but wet etching is more preferred. The reason is that the cost of wet etching is lower than that of dry etching and damage to the surface of the single-crystal substrate 1 in wet etching is more suppressed than that in dry etching.

FIG. 15 illustrates a case in which the inferior crystalline film 2b is completely removed by etching treatment from the single-crystal substrate 1 having the crystalline film 2, but the inferior crystalline film 2b may remain insofar as a desired rough shape is formed on the surface of the single-crystalline film 2a.

Figure 16:
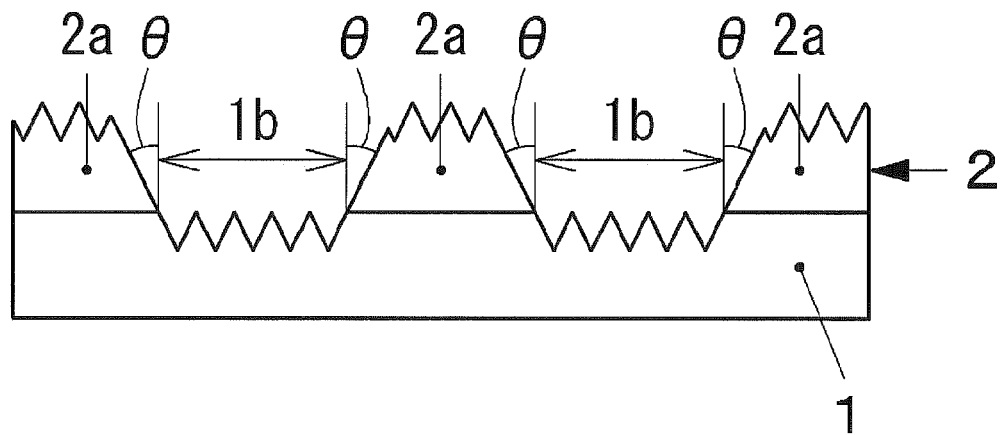
FIG. 16 A side view illustrating another exemplary modification of the single-crystal substrate having a crystalline film according to the embodiment of the present invention.

Further, side surfaces of the single-crystalline film 2a may be exposed by removing at least part of the inferior crystalline film 2b by etching and the side surfaces may be formed so as to be inclined at an angle θ as illustrated in FIG. 16. The angle θ is defined as an angle with respect to the direction of the normal to the surface of the single-crystal substrate 1. The angle θ is set to be an angle which is equal to or larger than a critical angle $\{\sin^{-1}(na/n2a)\}$ that is determined by a refractive index n2a of a material forming the single-crystalline film 2a and a refractive index na of the atmosphere outside the single-crystalline film 2a. By causing light having an incident angle which is equal to or larger than the critical angle to be reflected by the side surfaces of the single-crystalline film 2a and by the surface of the single-crystalline film 2a a plurality of times, the probability of extracting the light to the outside can be improved. Accordingly, it is necessary that a relationship (refractive index n2a>refractive index na) be satisfied, and thus, the single-crystalline film 2a is formed of a material having a refractive index which is larger than the refractive index na of the atmosphere. As an example, when the single-crystalline film 2a is formed of GaN, the angle θ is set to be 24 degrees or more.

Note that, in FIG. 15 or FIG. 16, the single-crystalline film 2a may be formed by setting the width t of the roughened surface 1b to be more than 0 μm and 80 μm or less (more preferably, more than 0 μm and 10 μm or less).

Further, as illustrated in FIG. 9 (A), a mask 3 is patterned and formed on part of the surface of the inferior crystalline film 2b of the crystalline film 2, which is obtained by being separated from the single-crystal substrate 1. As a material of the mask 3, $SiO_2$ is used. Then, by performing the HVPE method under conditions equal to those for the epitaxial growth of the crystalline film 2 illustrated in FIG. 8, a second single-crystalline film 2a1 is formed on the surface of the single-crystalline film 2a and on the surface of the mask 3 to a predetermined thickness as illustrated in FIG. 9 (B). In this case, the second single-crystalline film 2a1 is not epitaxially grown on the surface of the mask 3, and thus, the second single-crystalline film 2a1 is epitaxially grown from the surface of the single-crystalline film 2a which is not covered with the mask 3. When the growth further proceeds, the second single-crystalline film 2a1 is epitaxially grown from the single-crystalline film 2a in a direction in parallel to the surface of the crystalline film 2 (in the horizontal direction of FIG. 9(A) and FIG. 9(B)).

On the other hand, by performing the HVPE method under conditions equal to those for the epitaxial growth of the crystalline film 2 illustrated in FIG. 8, a crystalline film (hereinafter referred to as "second inferior crystalline film") 2b1 having inferior crystallinity to the second single-crystalline film 2a1 is epitaxially grown, to a predetermined thickness, on the surface of the inferior crystalline film 2b having no mask 3 formed thereon.

Figure 9A:
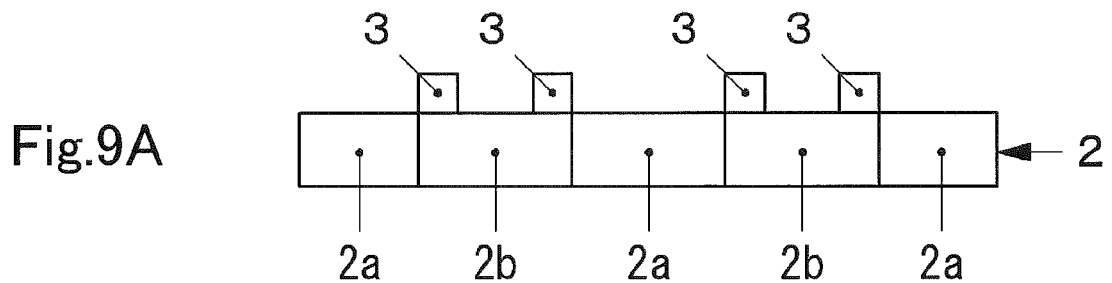
FIG. 9(A) is a view illustrating a state in which a mask is patterned on the surface of the crystalline film illustrated in FIG. 8.
Figure 9B:
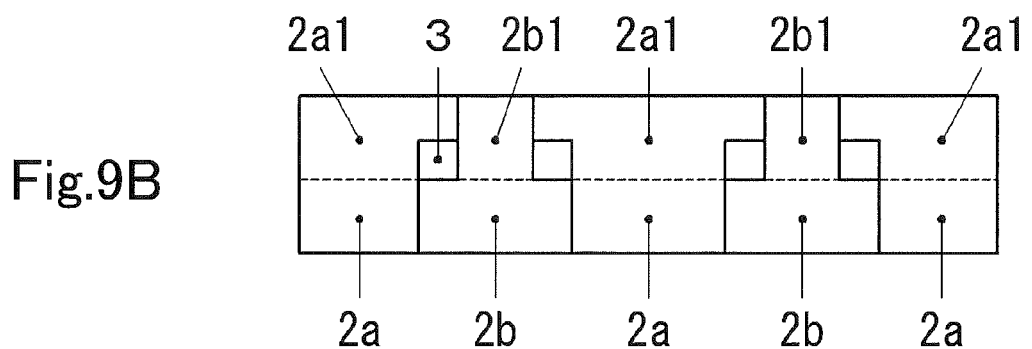
FIG. 9(B) is a view illustrating a state in which a second single-crystalline film and a second inferior crystalline film are formed on the surface of the crystalline film having the mask provided thereon illustrated in FIG. 9(A)
Figure 9C:
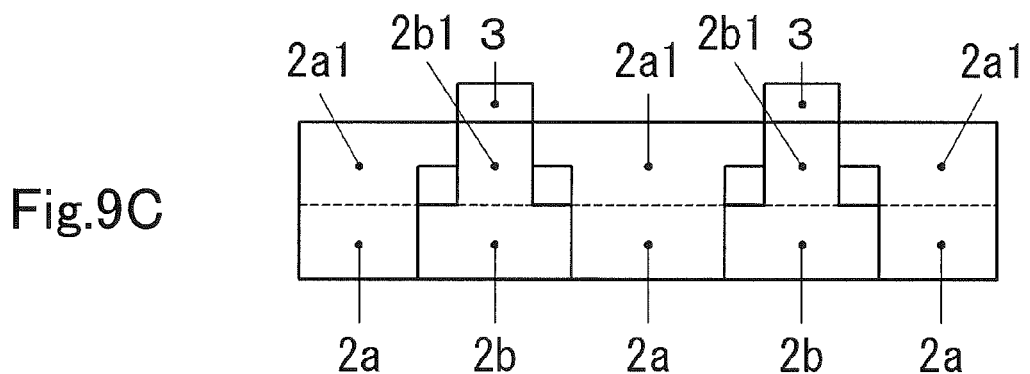
FIG. 9(C) is a view illustrating a state in which a mask is patterned on the second inferior crystalline film illustrated in FIG. 9(B)

After the second single-crystalline film 2a1 and the second inferior crystalline film 2b1 are formed, further, as illustrated in FIG. 9(C), the mask 3 is patterned and formed on the surface of the second inferior crystalline film 2b1. Then, by performing the HVPE method under conditions equal to those described above, a third single-crystalline film 2a2 is formed on the surface of the second single-crystalline film 2a1 and on the surface of the mask 3. In this case, the third single-crystalline film 2a2 is not epitaxially grown on the surface of the mask 3, and thus, the third single-crystalline film 2a2 is epitaxially grown from the second single-crystalline film 2a1 which is not covered with the mask 3. When the growth further proceeds, the third single-crystalline film 2a2 is epitaxially grown from the single-crystalline film 2a1 in the direction in parallel to the surface of the crystalline film 2 (in the horizontal direction of FIG. 9(C) and FIG. 9(D)).

Figure 9D:
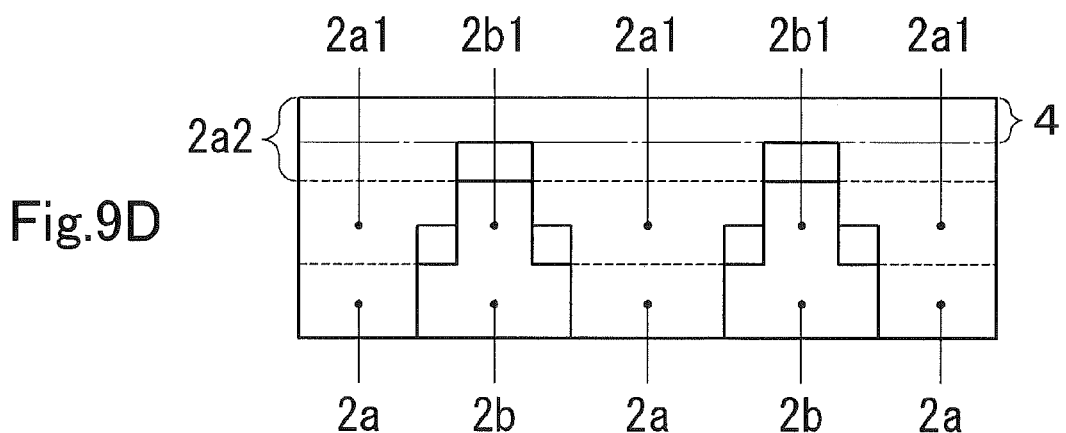
FIG. 9(D) is a view illustrating a state in which a third single-crystalline film is formed so as to cover the surfaces of the second single-crystalline film and of the mask illustrated in FIG. 9(C).

The steps from forming the mask to epitaxially growing the single-crystalline film and the inferior crystalline film to a predetermined thickness are repeated, and the portion in which the inferior crystalline film is formed is reduced every time the mask is formed. Then, as illustrated in FIG. 9(C), when the mask is formed, the entire surface of the inferior crystalline film is completely covered with the mask. Then, as illustrated in FIG. 9(D), the steps from forming the mask to epitaxially growing the single-crystalline film and the inferior crystalline film are repeated until there is no portion in which the inferior crystalline film is formed when the single-crystalline film (2a2 in FIG. 9(D)) is epitaxially grown.

A crystalline substrate 4 formed of only a single-crystalline film is obtained from the third single-crystalline film 2a2. When a substrate having a diameter of 2 inches or more is used as the single-crystal substrate 1, the crystalline substrate 4 at this time has a diameter of 2 inches or more and a thickness of about 500 μm, and is provided under a state in which there is no crack or no chip in the peripheral portion. As described above, the crystalline film 2 having a thickness of 300 μm or more is used as a substrate for epitaxial growth of the second single-crystalline film 2a1 and the second inferior crystalline film 2b1, and thus, a crystalline film without a rough shape formed on the surface of the single-crystalline film 2a as illustrated in FIG. 15 or FIG. 16 is used.

By further performing various downstream processes on the single-crystal substrate 1 having the crystalline film 2 or on the crystalline substrate 4 made through the production method described above, various elements may be made. In this case, in a downstream process, through performing at least an element portion forming step of making an element portion which functions as any one element selected from the group consisting of a light-emitting element, a photovoltaic element, and a semiconductor element by carrying out at least patterning treatment on the crystalline film 2 of the single-crystal substrate 1 having the crystalline film 2 or on the crystalline substrate 4, it is possible to produce an element that includes the element portion and the single-crystal substrate 1 having the crystalline film 2 or the crystalline substrate 4, which has a size substantially corresponding to the element portion. Further, in producing the element, as downstream processes, besides the element portion forming step, a polishing step, a line-for-division forming step, and a division step may be performed in this order.

In this case, specifically, through a method of producing an element using the single-crystal substrate 1 having the crystalline film 2 or the crystalline substrate 4, it is possible to make an element that includes the element portion and the single-crystal substrate 1 having the crystalline film 2 or the crystalline substrate 4, which has a size substantially corresponding to the element portion, by performing at least the following steps (1) to (4) in sequence:

(1) the element portion forming step of forming the individual element portions by patterning the crystalline film 2 of the single-crystal substrate 1 having the crystalline film 2 or the crystalline substrate 4;

(2) the polishing step of polishing another surface of the single-crystal substrate 1 having the crystalline film 2 including the element portions or the crystalline substrate 4 including the element portions, which has the one surface on which the element portions are formed, the another surface not having the element portions formed thereon;

(3) the line-for-division forming step of forming a line for division by applying a laser or by forming a notch with use of a scriber or the like along a border line between the individual element portions from the side of the surface which is polished in the polishing step; and (4) the division step of dividing the single-crystal substrate 1 having the crystalline film 2 including the element portions or the crystalline substrate 4 including the element portions on a basis of each element portion by applying an external force along the line for division formed in the the line-for-division forming step.

In this manner, it is possible to obtain an element portion that includes the single-crystal substrate 1 having the crystalline film 2 or the crystalline substrate 4, which has a size substantially corresponding to the element portion, and thus, with use of the element portion, any one of a light-emitting element such as an LED, a photovoltaic element, and a semiconductor element may be obtained. Therefore, by using the single-crystal substrate 1 having the crystalline film 2 or the crystalline substrate 4 which has no crack or no chip in the peripheral portion, various elements with improved quality and yield may be provided.

When the single-crystal substrate 1 having the crystalline film 2 is used, by setting the width t of the roughened surface 1b to be more than 0 μm and 80 μm or less, or more than 0 μm and 10 μm or less as described above, the roughened surface portion may also be used as the line for division as it is.

Further, by using, in the element production step, the single-crystal substrate 1 having the crystalline film 2 which has a rough portion formed on the surface of the crystalline film 2 as illustrated in FIG. 15, the light taking out efficiency of the light-emitting element such as an LED may be improved, which is preferred.

Further, by using, in the element production step, the single-crystal substrate 1 having the crystalline film 2 in which the side surfaces of the single-crystalline film 2a are formed so as to be inclined at the angle θ as illustrated in FIG. 16, the probability of extracting light to the outside of the light-emitting element such as an LED may be improved, which is more preferred.

EXAMPLES

Next, examples of the present invention are described, but the present invention is not limited to the following examples.

Examples 1 to 4

As Examples 1 to 4, the curvature behavior of the single-crystal substrate 1 is described when the buffer layer was formed and the crystalline film 2 formed by laminating the n-GaN-based layer and the InGaN-based active layer was epitaxially grown on the single-crystal substrate 1, in which the pattern of the roughened surface 1b was set to be in the shape of a cross formed so as to be perpendicular to and in parallel to the orientation flat surface of the single-crystal substrate 1 as illustrated in FIG. 2.

As samples for evaluation, the single-crystal substrate 1 having the crystalline film 2 was made, in which the buffer layer and the crystalline film 2 including the n-GaN-based layer and the InGaN-based active layer were formed on the one surface of the single-crystal substrate 1 corresponding to the crystal growth surface, the single-crystal substrate 1 having the shape of the pattern of the roughened surface illustrated in FIG. 2 and being made of sapphire. The curvature of the single-crystal substrate 1 after the crystalline film was formed was evaluated. Details of test conditions and the result of the evaluation are described in the following.

—Single-Crystal Substrate—

As the single-crystal substrate 1, a circular sapphire substrate having an orientation flat surface (diameter: 2 inches (50 mm), thickness: 430 μm) was used. Note that, one surface of this sapphire substrate was polished into a mirror-smooth state having a surface roughness Ra of 0.1 nm. The crystalline film 2 was formed with the surface polished into a mirror-smooth state being the crystal growth surface. The amount of warpage of the sapphire substrate under a state in which no film forming treatment was carried out was in a range of ±10 μm.

—Structure of Shape of Pattern of Roughened Surface and Conditions of Forming Roughened Surface—

The roughened surface 1*b* having the shape of the pattern as illustrated in FIG. 2 was formed on the crystal growth surface of the sapphire substrate. The roughened surface 1*b* was formed into the shape of a cross perpendicular to and in parallel to the orientation flat surface of the sapphire substrate. The widthwise center portion of each roughened surface formed so as to be perpendicular to and in parallel to the orientation flat surface was formed so as to pass through the center point of the sapphire substrate, and the roughened surfaces 1*b* crossed each other at 90 degrees. Further, the crystal growth surface of the sapphire substrate was the C-plane, and the surface roughness Ra of the portion of the crystal growth surface in which the roughened surface 1*b* was formed was 2 μm. Further, as the method of forming the roughened surface 1*b*, blasting treatment was used, masking of the crystal growth surface of the sapphire substrate was carried out by photolithography, and a photoresist was used as the masking material. Further, as a material to be ejected in the blasting treatment, a polishing material made of an alumina material having an average particle size of 20 μm to 80 μm was used. After the blasting treatment, in order to remove the material ejected onto the crystal growth surface, the crystal growth surface was cleaned. In this example, four samples in which the width t of the roughened-surface formed portion was changed were made. The widths t were 0.1 mm, 0.5 mm, 1.0 mm, and 2.0 mm.

—Layer Structure and Film Formation Conditions of Crystalline Film—

A multilayered film including the buffer layer and the crystalline film was formed on the crystal growth surface of the sapphire substrate. The crystalline film 2 had a two-layer structure in which the InGaN-based active layer was formed and laminated on the n-GaN-based layer. Note that, the specific film formation conditions were as follows, and the following process steps (1) to (5) were carried out in this order. Further, the thickness of the crystalline film 2 was 3.908 μm.

(1) Thermal Cleaning

After the sapphire substrate was placed in an MOCVD apparatus, the crystal growth surface was subjected to thermal cleaning for about 120 seconds under a state in which the substrate temperature was 1,100° C.

(2) Formation of Buffer Layer

The buffer layer was formed until the film thickness became 30 nm under a state in which the substrate temperature in the film formation was 530° C. and the film formation rate was 0.16 nm/s.

(3) Formation of n-GaN-Based Layer

The n-GaN-based layer was formed until the film thickness became 3,500 nm under a state in which the substrate temperature in the film formation was 1,050° C. and the film formation rate was 2,000 nm/hr.

(4) Formation of InGaN-Based Active Layer

The InGaN-based active layer was formed until the film thickness became 408 nm under a state in which the substrate temperature in the film formation was 750° C. and the film formation rate was 15 nm/min.

(5) Cooling

The sapphire substrate having the buffer layer, the n-GaN-based layer, and the InGaN-based active layer formed thereon in this order was cooled to a temperature in proximity to room temperature.

(Result of Evaluation)

—Evaluation of Curvature of Sapphire Substrate—

Figure 11:
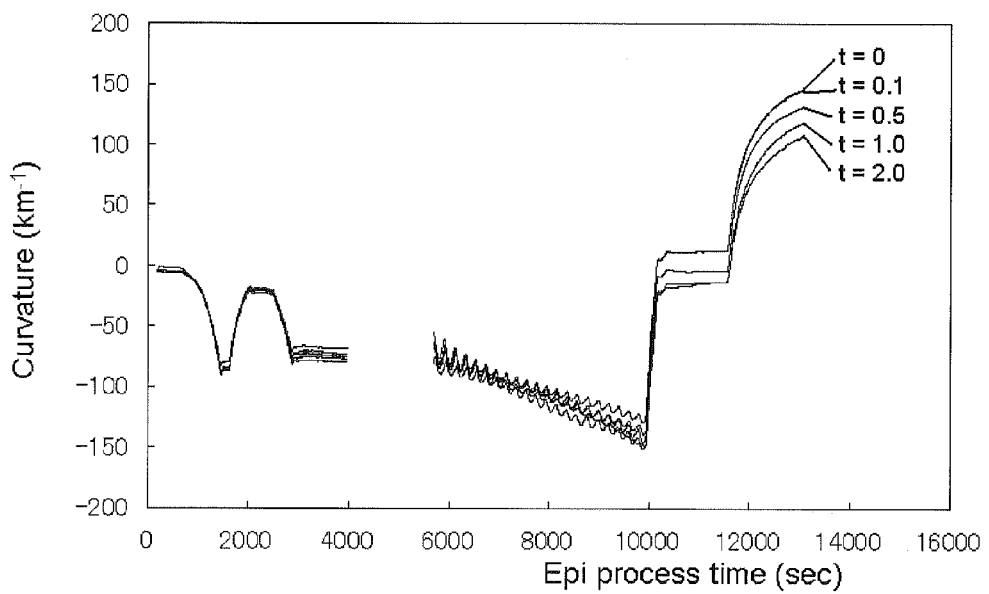
FIG. 11 A graph showing the result of measurement of the curvature behavior of a sapphire substrate in a multilayered film forming step with regard to samples having varying widths of a roughened-surface formed portion.

FIG. 11 shows the result of measurement of the curvature behavior of the sapphire substrate in a multilayered film forming step with regard to the samples having varying widths t of the portion in which the roughened surface 1*b* was formed. As shown in FIG. 11, it was found that, as the width t of the portion in which the roughened surface 1*b* was formed became larger and the proportion of the area of the portion of the crystal growth surface of the sapphire substrate in which the roughened surface 1*b* was formed became larger, the curvature (or the amount of warpage) of the sapphire substrate after the crystalline film 2 was formed was able to be decreased. The curvature of the sapphire substrate when the width t was 0.1 mm (No. 1/Example 1) was 153.1 $km^{-1}$, the curvature of the sapphire substrate when the width t was 0.5 mm (No. 2/Example 2) was 140.6 $km^{-1}$, the curvature of the sapphire substrate when the width t was 1.0 mm (No. 3/Example 3) was 125.0 $km^{-1}$, and the curvature of the sapphire substrate when the width t was 2.0 mm (No. 4/Example 4) was 118.8 $km^{-1}$. Note that, the curvature behavior shown in FIG. 11 was observed using the in-situ observation method.

—Evaluation of Curvature of Sapphire Substrate after Formation of Crystalline Film with Respect to Area of Roughened-Surface Formed Portion—

Figure 12:
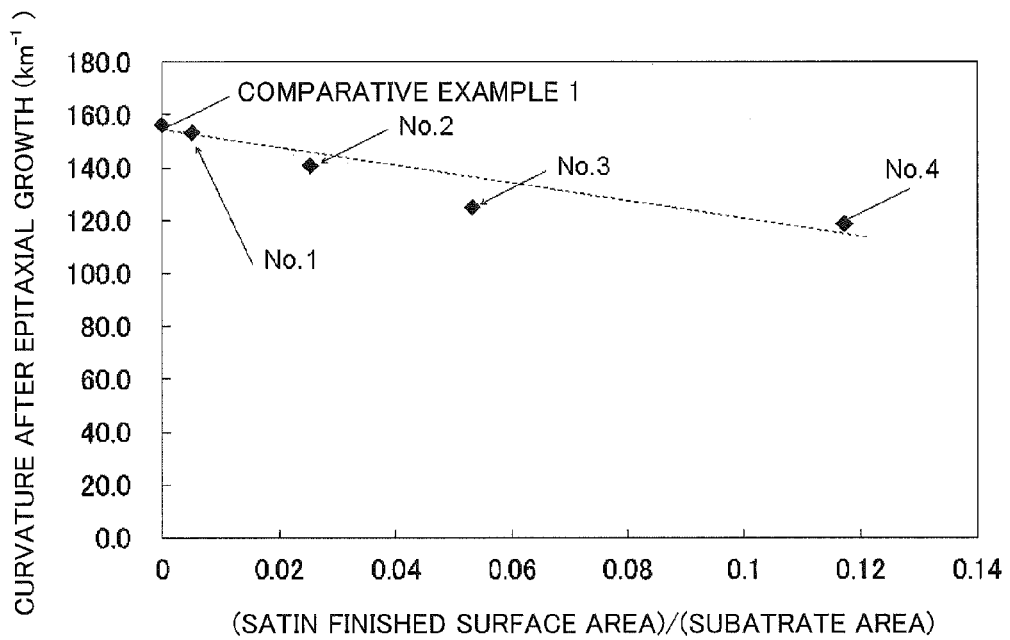
FIG. 12 A graph showing the proportion of the area of the roughened-surface formed portion versus the curvature of the sapphire substrate after a multilayered film is formed with regard to the samples of FIG. 11.

Further, with regard to each of Samples No. 1 to No. 4 shown in FIG. 11, the proportion of the area of the portion in which the roughened surface 1*b* was formed to the entire area of the surface of the sapphire substrate (crystal growth surface) was calculated. FIG. 12 is a graph showing the curvature of the sapphire substrate after the multilayered film was formed with respect to the proportion. As is clear from FIG. 12, it was found that, there was a proportional relationship between the proportion of the area of the portion in which the roughened surface 1*b* was formed to the entire area of the crystal growth surface and the curvature of the sapphire substrate after the crystalline film 2 was formed, and that, as the area of the portion in which the roughened surface 1*b* was formed increased, the curvature of the sapphire substrate after the crystalline film 2 was formed was able to be decreased. More specifically, it was found that, as the area of the portion in which the roughened surface 1*b* was formed increased, the inferior crystalline film portion increased, and as a result, internal stress caused in the entire crystalline film 2 was released to the outside of the crystalline film 2, to thereby decrease the curvature of the sapphire substrate after the crystalline film 2 was formed.

Comparative Example 1

Next, Comparative Example 1 is described. Comparative Example 1 is different from Examples 1 to 4 in that the roughened surface 1b was not formed on the sapphire substrate of Comparative Example 1. Other conditions are the same as those of Examples 1 to 4, and thus, description thereof is omitted.

FIG. 11 shows the result of measurement of the curvature behavior of the sapphire substrate in the multilayered film forming step with regard to a sample of Comparative Example 1 (the width t of the roughened-surface formed portion was zero). Compared with the cases of Examples 1 to 4, it was found that the curvature (or the amount of warpage) of the sapphire substrate of Comparative Example 1 after the crystalline film 2 was formed was the largest. The curvature of the sapphire substrate of Comparative Example 1 was 156.3 $km^{-1}$. Note that, the curvature behavior of Comparative Example 1 was also observed using the in-situ observation method.

Further, FIG. 12 shows the curvature of the sapphire substrate after the multilayered film was formed in Comparative Example 1. As is clear from FIG. 12, it was found that the case of the comparative example was also plotted on the line representing the proportional relationship.

Examples 5 to 7

As Examples 5 to 7, the curvature behavior of the single-crystal substrate 1 is described below when the buffer layer was formed and the crystalline film 2 formed by laminating the n-GaN-based layer and the InGaN-based active layer was epitaxially grown on the single-crystal substrate 1, in which the pattern of the roughened surface 1b was set to be in the shape of a cross formed so as to be perpendicular to and in parallel to the orientation flat surface of the single-crystal substrate 1 as illustrated in FIG. 3.

As samples for evaluation, the single-crystal substrate 1 having the crystalline film 2 was made, in which the buffer layer and the crystalline film 2 including the n-GaN-based layer and the InGaN-based active layer were formed on the one surface of the single-crystal substrate 1 corresponding to the crystal growth surface, the single-crystal substrate 1 having the shape of the pattern of the roughened surface illustrated in FIG. 3 and being made of sapphire. The curvature of the single-crystal substrate 1 after the crystalline film 2 was formed was evaluated. Details of test conditions and the result of the evaluation are described in the following.

—Single-Crystal Substrate—

As the single-crystal substrate 1, a circular sapphire substrate having an orientation flat surface (diameter: 2 inches (50 mm), thickness: 430 µm) was used. Note that, one surface of this sapphire substrate was polished into a mirror-smooth state having a surface roughness Ra of 0.1 nm. The crystalline film 2 was formed with the surface polished into a mirror-smooth state being the crystal growth surface. The amount of warpage of the sapphire substrate under a state in which no film forming treatment was carried out was in a range of ±10 µm.

—Structure of Shape of Pattern of Roughened Surface and Conditions of Forming Roughened Surface—

The roughened surface 1b having the shape of the pattern as illustrated in FIG. 3 was formed on the crystal growth surface of the sapphire substrate. The roughened surface 1b was formed into the shape of a cross perpendicular to and in parallel to the orientation flat surface of the sapphire substrate, and was formed so as to be perpendicular to and in parallel to the orientation flat surface. The roughened surfaces 1b crossed each other at 90 degrees. Further, the crystal growth surface of the sapphire substrate 1S was the C-plane, and the surface roughness Ra of the portion of the crystal growth surface in which the roughened surface 1b was formed was 0.5 µm. Further, as the method of forming the roughened surface 1b, dry etching treatment was used, masking of the crystal growth surface of the sapphire substrate was carried out by photolithography, and an Ni film and a photoresist were used as the masking material. In this example, each interval between the portions in which the roughened surface 1b was formed was 300 µm, and four samples in which the width t of the roughened surface was changed were made. The widths t were 4 µm, 8 µm, and 16 µm.

—Layer Structure and Film Formation Conditions of Crystalline Film—

A multilayered film including the buffer layer and the crystalline film 2 was formed on the crystal growth surface of the sapphire substrate. The crystalline film 2 had a two-layer structure in which the InGaN-based active layer was formed and laminated on the n-GaN-based layer. Note that, the specific film formation conditions were as follows, and the following process steps (1) to (5) were carried out in this order. Further, the thickness of the crystalline film 2 was 3.908 µm.

(1) Thermal Cleaning

After the sapphire substrate was placed in an MOCVD apparatus, the crystal growth surface was subjected to thermal cleaning for about 120 seconds under a state in which the substrate temperature was 1,100° C.

(2) Formation of Buffer Layer

The buffer layer was formed until the film thickness became 30 nm under a state in which the substrate temperature in the film formation was 530° C. and the film formation rate was 0.16 nm/s.

(3) Formation of n-GaN-Based Layer

The n-GaN-based layer was formed until the film thickness became 3,500 nm under a state in which the substrate temperature in the film formation was 1,050° C. and the film formation rate was 2,000 nm/hr.

(4) Formation of InGaN-based Active Layer

The InGaN-based active layer was formed until the film thickness became 408 nm under a state in which the substrate temperature in the film formation was 750° C. and the film formation rate was 15 nm/min.

(5) Cooling

The sapphire substrate having the buffer layer, the n-GaN-based layer, and the InGaN-based active layer formed thereon in this order was cooled to a temperature in proximity to room temperature.

(Result of Evaluation)

—Evaluation of Curvature of Sapphire Substrate—

Figure 17:
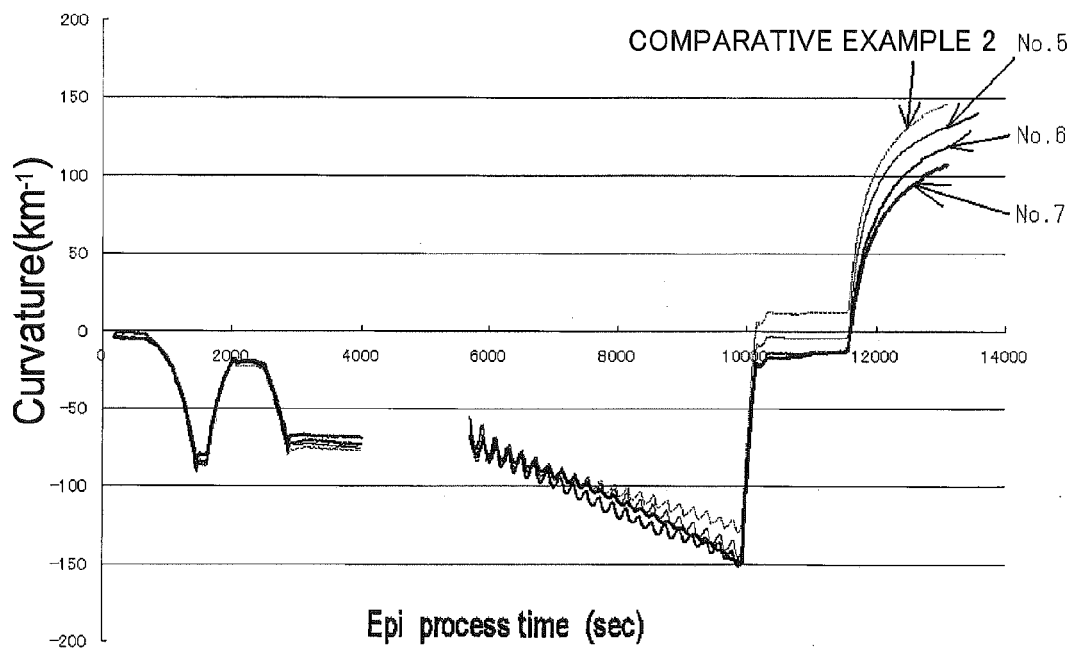
FIG. 17 A graph showing the result of measurement of the curvature behavior of the sapphire substrate in the multilayered film forming step with regard to samples having varying widths of the roughened-surface formed portion.

FIG. 17 shows the result of measurement of the curvature behavior of the sapphire substrate in a multilayered film forming step with regard to the samples having varying widths t of the portion in which the roughened surface 1b was formed. As shown in FIG. 17, it was found that, as the width t of the portion in which the roughened surface 1b was formed became larger and the proportion of the area of the portion of the crystal growth surface of the sapphire substrate in which the roughened surface 1b was formed became larger, the curvature (or the amount of warpage) of the sapphire substrate after the crystalline film 2 was formed was able to be decreased. The curvature of the sapphire substrate when the width t was 4 µm (No. 5/Example 5) was 137.5 $km^{-1}$, the curvature of the sapphire substrate when the width t was 8 µm (No. 6/Example 6) was 128.1 $km^{-1}$, and the curvature of the sapphire substrate when the width t was 16 µm (No. 7/Example 7) was 115.6 km$^{-1}$. Note that, the curvature behavior shown in FIG. 17 was observed using the in-situ observation method.

—Evaluation of Curvature of Sapphire Substrate after Formation of Crystalline Film with Respect to Area of Roughened-Surface Formed Portion—

Figure 18:
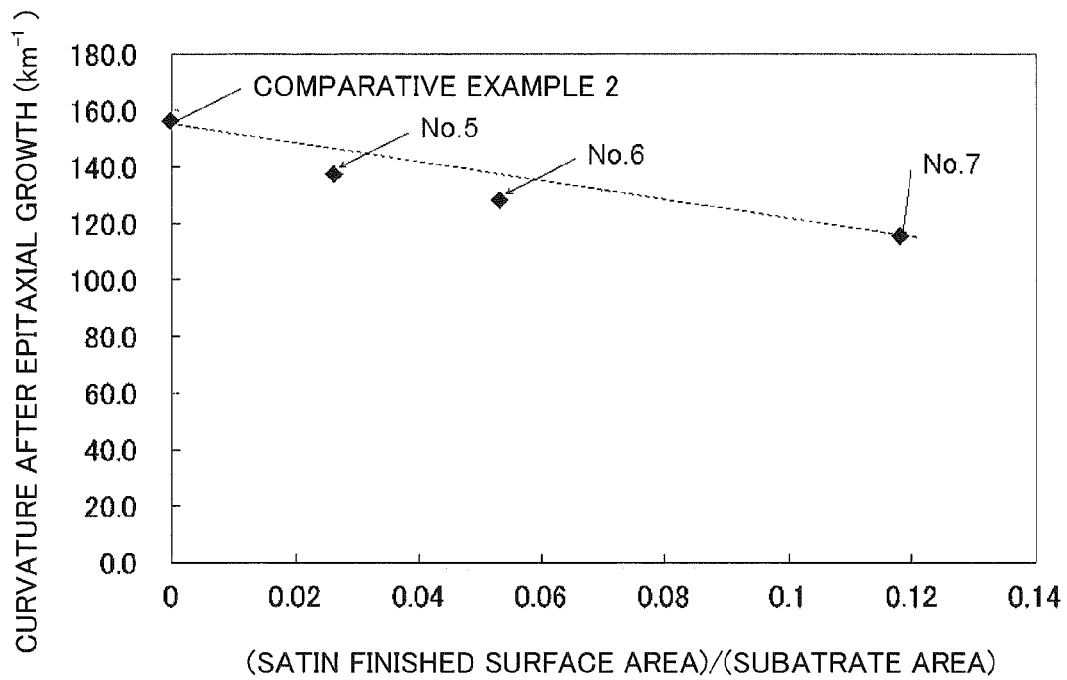
FIG. 18 A graph showing the proportion of the area of the roughened-surface formed portion versus the curvature of the sapphire substrate after the multilayered film is formed with regard to the samples of FIG. 17.

Further, with regard to each of Samples No. 5 to No. 7 shown in FIG. 17, the proportion of the area of the portion in which the roughened surface 1b was formed to the entire area of the surface of the sapphire substrate (crystal growth surface) was calculated. FIG. 18 is a graph showing the curvature of the sapphire substrate after the multilayered film was formed with respect to the proportion. As is clear from FIG. 18, it was found that, there was a proportional relationship between the proportion of the area of the portion in which the roughened surface 1b was formed to the entire area of the crystal growth surface and the curvature of the sapphire substrate after the crystalline film 2 was formed, and that, as the area of the portion in which the roughened surface 1b was formed increased, the curvature of the sapphire substrate after the crystalline film 2 was formed was able to be decreased. More specifically, it was found that, as the area of the portion in which the roughened surface 1b was formed increased, the inferior crystalline film portion increased, and as a result, internal stress caused in the entire crystalline film 2 was released to the outside of the crystalline film 2, to thereby decrease the curvature of the sapphire substrate after the crystalline film 2 was formed.

Comparative Example 2

Next, Comparative Example 2 is described. Comparative Example 2 is different from Examples 5 to 7 in that the roughened surface 1b was not formed on the sapphire substrate of Comparative Example 2. Other conditions are the same as those of Examples 5 to 7, and thus, description thereof is omitted.

FIG. 17 shows the result of measurement of the curvature behavior of the sapphire substrate in the multilayered film forming step with regard to a sample of Comparative Example 2 (the width t of the portion in which the roughened surface 1b was formed was zero). Compared with the cases of Examples 5 to 7, it was found that the curvature (or the amount of warpage) of the sapphire substrate of Comparative Example 2 after the crystalline film was formed was the largest. The curvature of the sapphire substrate of Comparative Example 2 was 156.3 km$^{-1}$. Note that, the curvature behavior of Comparative Example 2 was also observed using the in-situ observation method.

Further, FIG. 18 shows the curvature of the sapphire substrate after the multilayered film was formed in Comparative Example 2. As is clear from FIG. 18, it was found that the case of Comparative Example 2 was also plotted on the line representing the proportional relationship.

The invention claimed is:

1. A single-crystal substrate having a roughened surface formed on at least a partial region of a surface of the single-crystal substrate,
   wherein the roughened surface is formed by a treatment selected from the group consisting of blasting treatment and etching treatment, and
   wherein the roughened surface formed on the surface of the single-crystal substrate is in a shape of any one of stripes, a cross, a lattice, a plurality of arranged polygons, concentric circles, a coil, a line symmetry with respect to a straight line passing through a center point of the single-crystal substrate, and a point symmetry with respect to the center point of the single-crystal substrate.

2. A single-crystal substrate according to claim 1, wherein the roughened surface is formed on the surface of the single-crystal substrate so as to be discontinuous.

3. A single-crystal substrate according to claim 1 or 2, wherein a diameter of the single-crystal substrate is 2 inches or more.

4. A single-crystal substrate according to claim 1, wherein a width of the roughened surface is more than 0 μm and 80 μm or less.

5. A single-crystal substrate according to claim 4, wherein the width of the roughened surface is more than 0 μm and 10 μm or less.

6. A single-crystal substrate according to claim 1, wherein an area of the partial region in which the roughened surface is formed with respect to an entire area of the surface of the single-crystal substrate is in a range of more than 0% and 50% or less.

7. A single-crystal substrate having a crystalline film, in which:
   a single-crystalline film is formed on a roughened-surface unformed surface, on which the roughened surface is not formed, of the single-crystal substrate;
   a crystalline film having inferior crystallinity to the single-crystalline film is formed on a roughened-surface formed surface, on which the roughened surface is formed; and
   further, the single-crystal substrate having a crystalline film is formed by a crystalline film including at least the single-crystalline film and the crystalline film having inferior crystallinity to the single-crystalline film, and the single-crystal substrate,
   wherein the single-crystal substrate having a roughened surface formed on at least a partial region of a surface of the single-crystal substrate and
   wherein the roughened surface is formed by a treatment selected from the group consisting of blasting treatment and etching treatment.

8. A single-crystal substrate having a crystalline film according to claim 7, wherein each of the single-crystalline film and the crystalline film having inferior crystallinity to the single-crystalline film comprises a nitride semiconductor film.

9. A single-crystal substrate having a crystalline film according to claim 7 or 8, wherein a material of the single-crystal substrate comprises sapphire.

10. A single-crystal substrate having a crystalline film according to claim 7, wherein roughness is formed on a surface of the single-crystalline film which is opposite to the surface facing the roughened-surface unformed surface.

11. A single-crystal substrate having a crystalline film according to claim 10, wherein side surfaces of the single-crystalline film are formed so as to be inclined at an angle which is equal to or larger than a critical angle that is determined by a refractive index of a material of the single-crystalline film and a refractive index of an atmosphere outside the single-crystalline film, provided that the critical angle is an angle with respect to a direction of a normal to the surface of the single-crystal substrate.

12. A crystalline film comprising the single-crystalline film and the crystalline film having inferior crystallinity to the single-crystalline film according to claim 7, wherein a thickness of the single-crystalline film and the crystalline film having inferior crystallinity to the single-crystalline film is 300 μm or more.

13. A method of producing a single-crystal substrate having a crystalline film, the method comprising:
forming a roughened surface on at least a partial region of a surface of the single-crystal substrate used for forming the crystalline film by epitaxial growth;
then, forming by epitaxial growth a single-crystalline film on a roughened-surface unformed surface on which the roughened surface is not formed; and
forming by epitaxial growth a crystalline film having inferior crystallinity to the single-crystalline film on a roughened-surface formed surface, on which the roughened surface is formed, of the single-crystal substrate,
the single-crystal substrate having a crystalline film being formed by the crystalline film including at least the single-crystalline film and the crystalline film having inferior crystallinity to the single-crystalline film, and the single-crystal substrate.

14. A method of producing a single-crystal substrate having a crystalline film according to claim 13, wherein the roughened surface formed on the surface of the single-crystal substrate is in a shape of any one of stripes, a cross, a lattice, a plurality of arranged polygons, concentric circles, a coil, a line symmetry with respect to a straight line passing through a center point of the single-crystal substrate, and a point symmetry with respect to the center point of the single-crystal substrate.

15. A method of producing a single-crystal substrate having a crystalline film according to claim 14, wherein the roughened surface is formed on the surface of the single-crystal substrate so as to be discontinuous.

16. A method of producing a single-crystal substrate having a crystalline film according to claim 13, wherein the roughened surface is formed over a plurality of portions which are independent of one another on the surface of the single-crystal substrate.

17. A method of producing a single-crystal substrate having a crystalline film according to any one of claims 13 to 15, wherein the single-crystal substrate comprises a single-crystal substrate having a diameter of 2 inches or more.

18. A method of producing a single-crystal substrate having a crystalline film according to claim 16, wherein the single-crystal substrate comprises a single-crystal substrate having a diameter of 2 inches or more.

19. A method of producing a single-crystal substrate having a crystalline film according to any one of claims 13 to 15, wherein each of the single-crystalline film and the crystalline film having inferior crystallinity to the single-crystalline film comprises a nitride semiconductor film.

20. A method of producing a single-crystal substrate having a crystalline film according to claim 16 or 18, wherein each of the single-crystalline film and the crystalline film having inferior crystallinity to the single-crystalline film comprises a nitride semiconductor film.

21. A method of producing a single-crystal substrate having a crystalline film according to claim 13, wherein a material of the single-crystal substrate comprises sapphire.

22. A method of producing a single-crystal substrate having a crystalline film according to claim 16, wherein a material of the single-crystal substrate comprises sapphire.

23. A method of producing a single-crystal substrate having a crystalline film according to claim 13, further comprising forming roughness by etching on a surface of the single-crystalline film which is opposite to the surface facing the roughened-surface unformed surface.

24. A method of producing a single-crystal substrate having a crystalline film according to claim 16, further comprising forming roughness by etching on a surface of the single-crystalline film which is opposite to the surface facing the roughened-surface unformed surface.

25. A method of producing a single-crystal substrate having a crystalline film according to claim 23, wherein the etching comprises wet etching.

26. A method of producing a single-crystal substrate having a crystalline film according to claim 24, wherein the etching comprises wet etching.

27. A method of producing a single-crystal substrate having a crystalline film according to claim 23 or 25, further comprising removing at least part of the crystalline film having inferior crystallinity to the single-crystalline film by the etching to expose side surfaces of the single-crystalline film,
wherein the side surfaces are formed so as to be inclined at an angle which is equal to or larger than a critical angle that is determined by a refractive index of a material of the single-crystalline film and a refractive index of an atmosphere outside the single-crystalline film, provided that the critical angle is an angle with respect to a direction of a normal to the surface of the single-crystal substrate.

28. A method of producing a single-crystal substrate having a crystalline film according to claim 24 or 26, further comprising removing at least part of the crystalline film having inferior crystallinity to the single-crystalline film by the etching to expose side surfaces of the single-crystalline film,
wherein the side surfaces are formed so as to be inclined at an angle which is equal to or larger than a critical angle that is determined by a refractive index of a material of the single-crystalline film and a refractive index of an atmosphere outside the single-crystalline film, provided that the critical angle is an angle with respect to a direction of a normal to the surface of the single-crystal substrate.

29. A method of producing a single-crystal substrate having a crystalline film according to claim 13, wherein the roughened surface is formed so as to have a width of more than 0 μm and 80 μm or less.

30. A method of producing a single-crystal substrate having a crystalline film according to claim 29, wherein the roughened surface is formed so as to have a width of more than 0 μm and 10 μm or less.

31. A method of producing a single-crystal substrate having a crystalline film according to claim 13, wherein an area of the partial region in which the roughened surface is formed with respect to an entire area of the surface of the single-crystal substrate is in a range of more than 0% and 50% or less.

32. A method of producing a crystalline substrate, the method comprising:
after forming a mask on part of a surface of the crystalline film having inferior crystallinity to the single-crystalline film of the crystalline film produced by the method of producing a single-crystal substrate having a crystalline film according to claim 16,
forming a second single-crystalline film on the surface of the single-crystalline film and on a surface of the mask; and
forming a crystalline film having inferior crystallinity to the second single-crystalline film on the surface of the crystalline film having inferior crystallinity to the single-crystalline film and on which the mask is not formed; and
after forming the second single-crystalline film and the crystalline film having inferior crystallinity to the second single-crystalline film to a predetermined thickness, repeating the steps from forming the mask to forming the single-crystalline film and the crystalline film having inferior crystallinity to the single-crystalline film to the predetermined thickness so that:

a portion where the crystalline film having inferior crystallinity to the single-crystalline film is formed is reduced every time the mask is formed; and the portion where the crystalline film having inferior crystallinity to the single-crystalline film is caused to completely disappear, thereby forming the crystalline substrate which is formed of only the single-crystalline film.

33. An element producing method of producing an element including an element portion and a single-crystal substrate having a crystalline film having a size that substantially corresponds to the element portion, the method at least comprising:

producing the single-crystal substrate having a crystalline film by the method of producing a single-crystal substrate having a crystalline film according to claim 13; and further, an element portion forming step of making the element portion, which functions as any one element selected from the group consisting of a light-emitting element, a photovoltaic element, and a semiconductor element, by carrying out at least patterning treatment on the crystalline film.

34. An element producing method of producing an element including an element portion and a crystalline substrate having a size that substantially corresponds to the element portion, the method at least comprising:

producing the crystalline substrate by the method of producing a crystalline substrate according to claim 32; and further, an element portion forming step of making the element portion, which functions as any one element selected from the group consisting of a light-emitting element, a photovoltaic element, and a semiconductor element, by carrying out at least patterning treatment on the crystalline substrate.

35. An element producing method of producing an element including an element portion and a single-crystal substrate having a crystalline film having a size that substantially corresponds to the element portion, the method at least comprising:

producing the single-crystal substrate having a crystalline film by the method of producing a single-crystal substrate having a crystalline film according to claim 29; and further, an element portion forming step of making the element portion, which functions as any one element selected from the group consisting of a light-emitting element, a photovoltaic element, and a semiconductor element, by carrying out at least patterning treatment on the crystalline film.

36. A single-crystal substrate having a roughened surface formed on at least a partial region of a surface of the single-crystal substrate, wherein surface roughness Ra of the roughened surface is 100 nm or more, and wherein the roughened surface formed on the surface of the single-crystal substrate is in a shape of any one of stripes, a cross, a lattice, a plurality of arranged polygons, concentric circles, a coil, a line symmetry with respect to a straight line passing through a center point of the single-crystal substrate, and a point symmetry with respect to the center point of the single-crystal substrate.

37. A single-crystal substrate according to claim 36, wherein the roughened surface is formed on the surface of the single-crystal substrate so as to be discontinuous.

38. A single-crystal substrate according to claim 36 or 37, wherein a diameter of the single-crystal substrate is 2 inches or more.

39. A single-crystal substrate according to claim 36, wherein a width of the roughened surface is more than 0 μm and 80 μm or less.

40. A single-crystal substrate according to claim 39, wherein the width of the roughened surface is more than 0 μm and 10 μm or less.

41. A single-crystal substrate according to claim 36, wherein an area of the partial region in which the roughened surface is formed with respect to an entire area of the surface of the single-crystal substrate is in a range of more than 0% and 50% or less.

42. A single-crystal substrate having a crystalline film, in which:

a single-crystalline film is formed on a roughened-surface unformed surface, on which the roughened surface is not formed, of the single-crystal substrate;

a crystalline film having inferior crystallinity to the single-crystalline film is formed on a roughened-surface formed surface, on which the roughened surface is formed; and further, the single-crystal substrate having a crystalline film is formed by a crystalline film including at least the single-crystalline film and the crystalline film having inferior crystallinity to the single-crystalline film, and the single-crystal substrate, and wherein surface roughness Ra of the roughened surface is 100 nm or more.

43. A single-crystal substrate having a crystalline film according to claim 42, wherein each of the single-crystalline film and the crystalline film having inferior crystallinity to the single-crystalline film comprises a nitride semiconductor film.

44. A single-crystal substrate having a crystalline film according to claim 42 or 43, wherein a material of the single-crystal substrate comprises sapphire.

45. A single-crystal substrate having a crystalline film according to claim 42, wherein roughness is formed on a surface of the single-crystalline film which is opposite to the surface facing the roughened-surface unformed surface.

46. A single-crystal substrate having a crystalline film according to claim 45, wherein side surfaces of the single-crystalline film are formed so as to be inclined at an angle which is equal to or larger than a critical angle that is determined by a refractive index of a material of the single-crystalline film and a refractive index of an atmosphere outside the single-crystalline film, provided that the critical angle is an angle with respect to a direction of a normal to the surface of the single-crystal substrate.

47. A crystalline film comprising the single-crystalline film and the crystalline film having inferior crystallinity to the single-crystalline film according to claim 42, wherein a thickness of the single-crystalline film and the crystalline film having inferior crystallinity to the single-crystalline film is 300 μm or more.

48. A single-crystal substrate having a crystalline film according to claim 7, wherein the roughened surface formed on the surface of the single-crystal substrate is in a shape of any one of stripes, a cross, a lattice, a plurality of arranged polygons, concentric circles, a coil, a line symmetry with respect to a straight line passing through a center point of the single-crystal substrate, and a point symmetry with respect to the center point of the single-crystal substrate.

49. A single-crystal substrate having a crystalline film according to claim 48, wherein the roughened surface is formed on the surface of the single-crystal substrate so as to be discontinuous.

50. A single-crystal substrate having a crystalline film according to any one of claim 7, 48 or 49, wherein a diameter of the single-crystal substrate is 2 inches or more.

51. A single-crystal substrate having a crystalline film according to claim 7, wherein a width of the roughened surface is more than 0 μm and 80 μm or less.

52. A single-crystal substrate having a crystalline film according to claim 51, wherein the width of the roughened surface is more than 0 μm and 10 μm or less.

53. A single-crystal substrate having a crystalline film according to claim 7, wherein an area of the partial region in which the roughened surface is formed with respect to an entire area of the surface of the single-crystal substrate is in a range of more than 0% and 50% or less.

54. A single-crystal substrate having a crystalline film according to claim 42, wherein the roughened surface formed on the surface of the single-crystal substrate is in a shape of any one of stripes, a cross, a lattice, a plurality of arranged polygons, concentric circles, a coil, a line symmetry with respect to a straight line passing through a center point of the single-crystal substrate, and a point symmetry with respect to the center point of the single-crystal substrate.

55. A single-crystal substrate having a crystalline film according to claim 54, wherein the roughened surface is formed on the surface of the single-crystal substrate so as to be discontinuous.

56. A single-crystal substrate having a crystalline film according to any one of claim 42, 54 or 55, wherein a diameter of the single-crystal substrate is 2 inches or more.

57. A single-crystal substrate having a crystalline film according to claim 42, wherein a width of the roughened surface is more than 0 μm and 80 μm or less.

58. A single-crystal substrate having a crystalline film according to claim 57, wherein the width of the roughened surface is more than 0 μm and 10 μm or less.

59. A single-crystal substrate having a crystalline film according to claim 42, wherein an area of the partial region in which the roughened surface is formed with respect to an entire area of the surface of the single-crystal substrate is in a range of more than 0% and 50% or less.

* * * * *